(12) United States Patent
Jeong et al.

(10) Patent No.: US 8,309,449 B2
(45) Date of Patent: Nov. 13, 2012

(54) SEMICONDUCTOR DEVICE AND METHOD FOR FORMING THE SAME

(75) Inventors: Mun Mo Jeong, Seoul (KR); Dong Geun Lee, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 352 days.

(21) Appl. No.: 12/650,261

(22) Filed: Dec. 30, 2009

(65) Prior Publication Data
US 2010/0327346 A1     Dec. 30, 2010

(30) Foreign Application Priority Data
Jun. 30, 2009   (KR) .................. 10-2009-0058724

(51) Int. Cl.
*H01L 21/3205* (2006.01)

(52) U.S. Cl. .. 438/589; 438/586; 438/587; 257/E21.177

(58) Field of Classification Search ............... 257/302, 257/330, 332, 334, E29.262, E21.177, E21.294; 438/586, 587, 589
See application file for complete search history.

(56) References Cited

U.S. PATENT DOCUMENTS

| 7,713,873 B2 * | 5/2010 | Kim et al. ................. 438/672 |
| 7,920,400 B2 * | 4/2011 | Lee et al. .................. 365/63 |
| 2009/0173994 A1 * | 7/2009 | Min et al. .................. 257/330 |
| 2010/0123189 A1 * | 5/2010 | Venkatraman et al. ....... 257/330 |

FOREIGN PATENT DOCUMENTS

| KR | 100596833 B1 | 6/2006 |
| KR | 1020070002688 A | 1/2007 |
| KR | 10-0720256 B1 | 5/2007 |
| KR | 10-2008-0099482 A | 11/2008 |

* cited by examiner

*Primary Examiner* — Matthew Landau
*Assistant Examiner* — Colleen E Snow

(57) ABSTRACT

A semiconductor and a method for forming the same are disclosed. The method for forming the semiconductor device includes forming a buried gate on a semiconductor substrate including an active region, forming an insulating layer on the semiconductor substrate, selectively removing the insulating layer from at least an upper part of the active region, forming a bit line on an upper part between the buried gates formed on the active region, and forming a storage electrode contact that is formed at both sides of the bit line and has an extended lower part, so that prevents short circuiting between the storage electrode contact and the bit line, and improves contact resistance by enlarging a contact area between the storage electrode contact and the active region, so that unique characteristics of the semiconductor device are improved.

20 Claims, 27 Drawing Sheets

(i)

(ii)

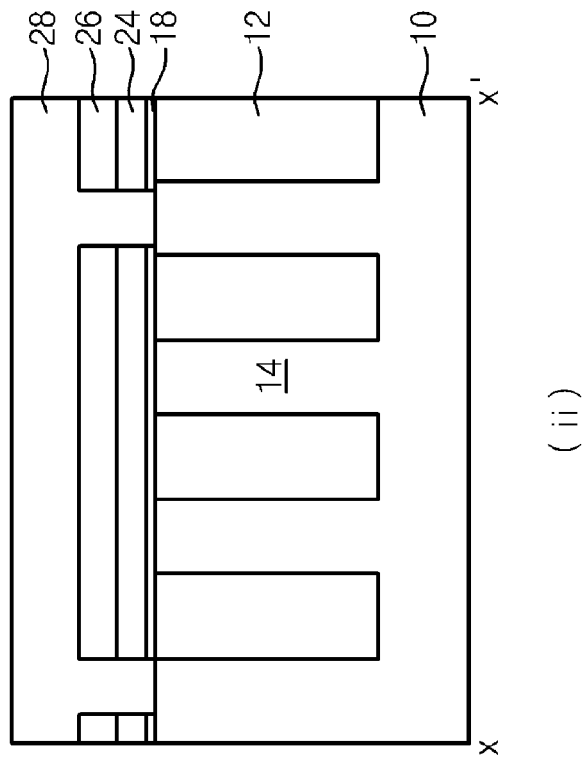
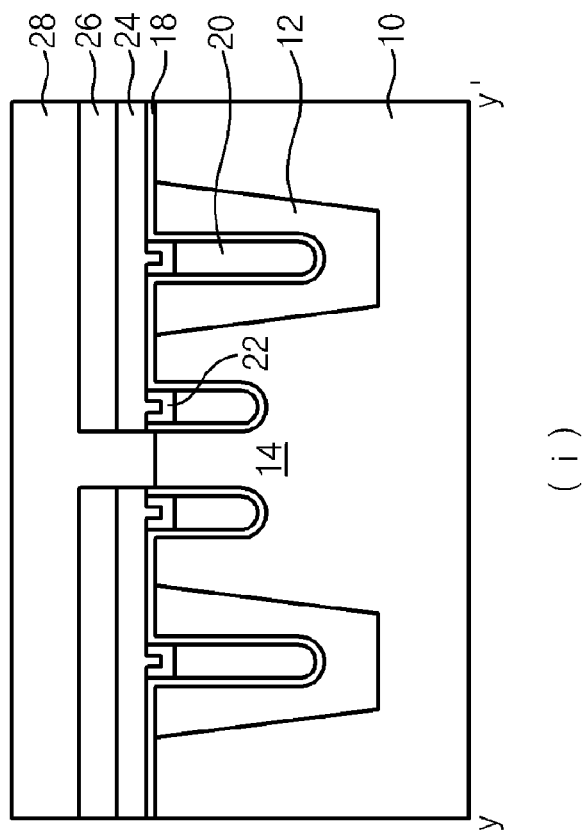
Fig. 2g

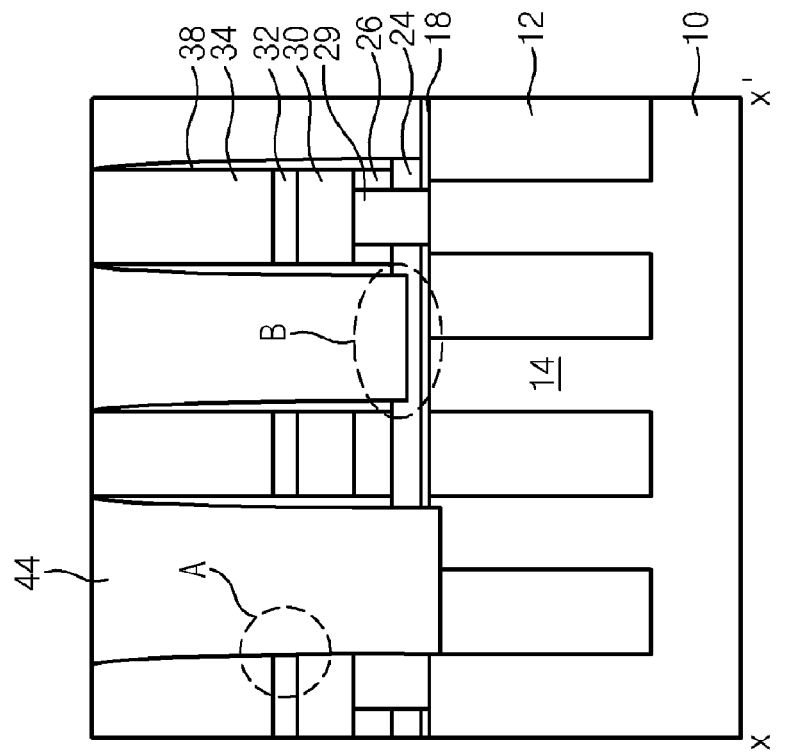
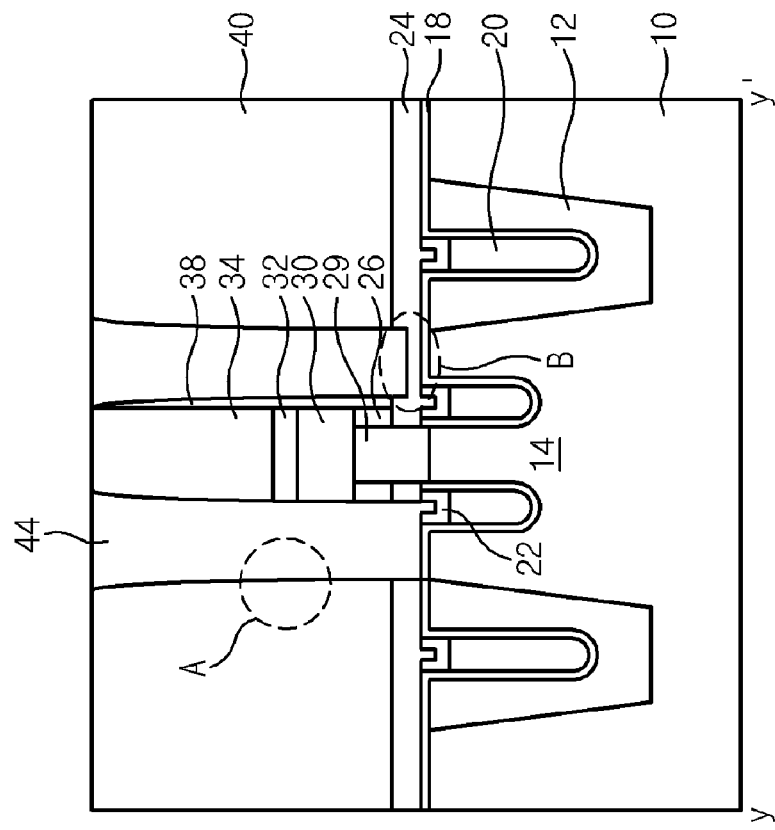
Fig.2j

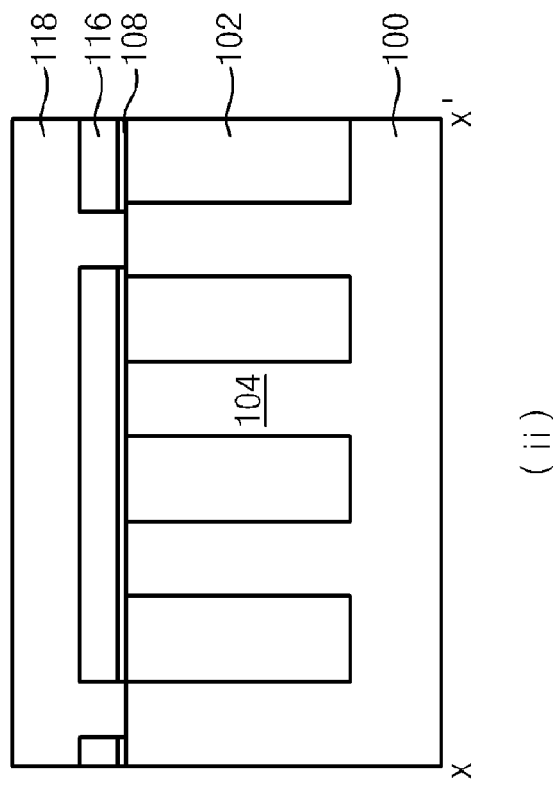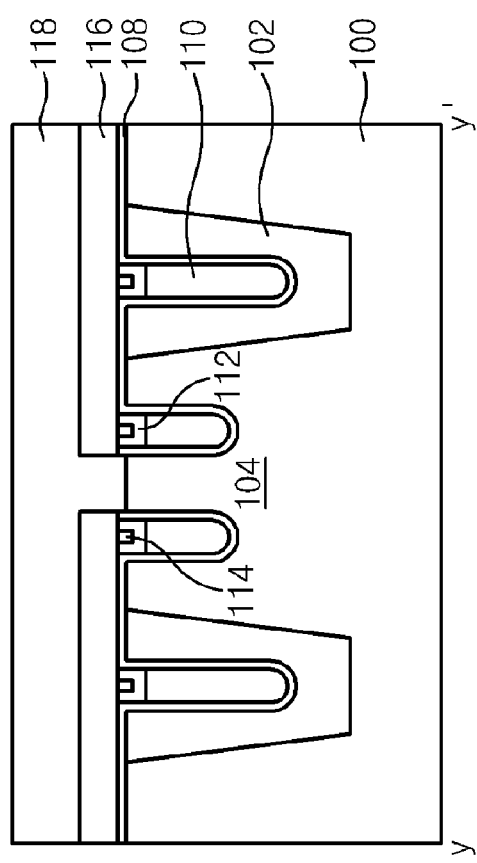
Fig. 4h

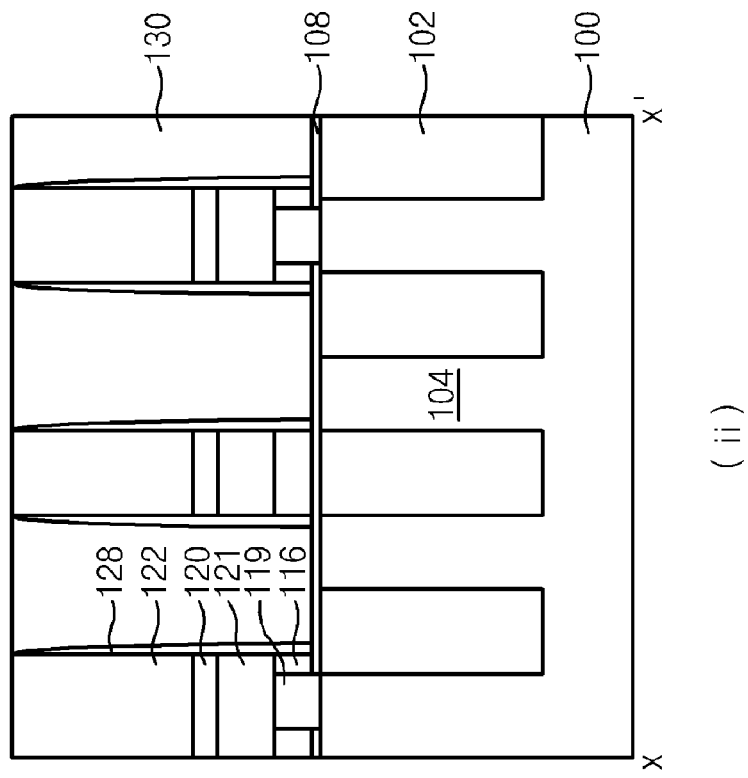
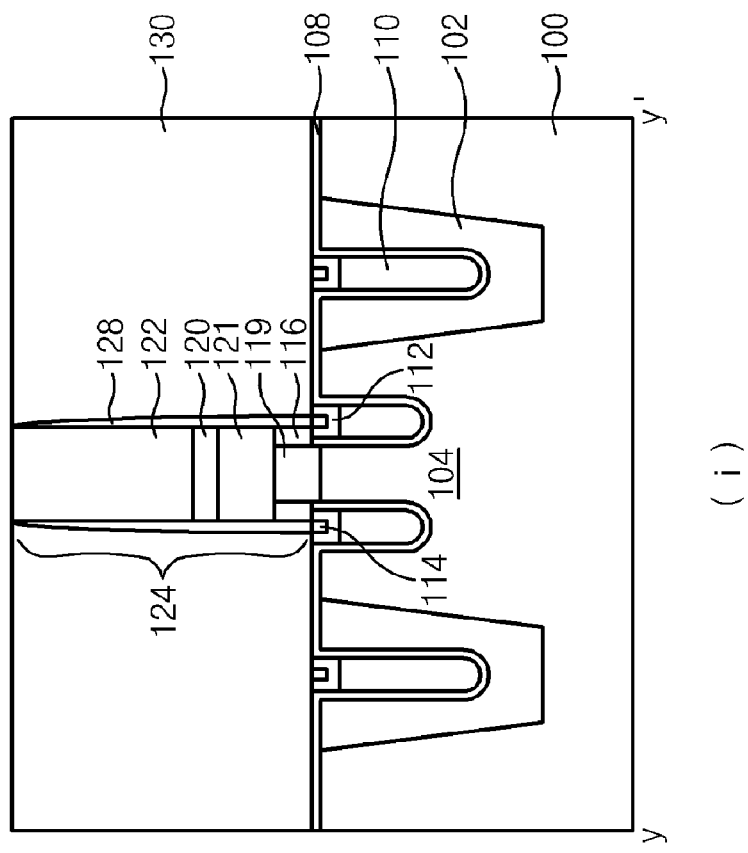
Fig. 4i

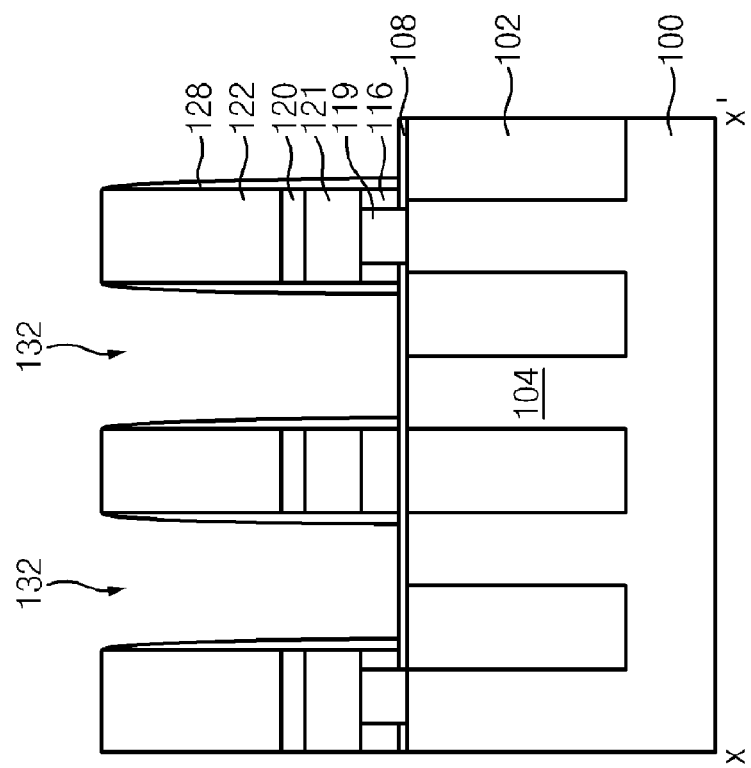
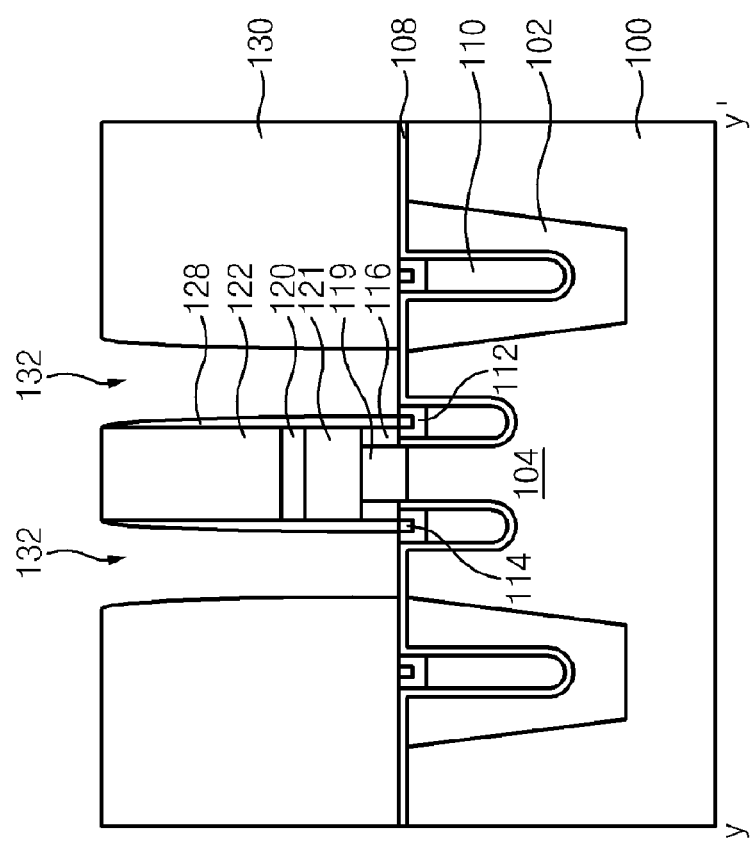
Fig. 4j

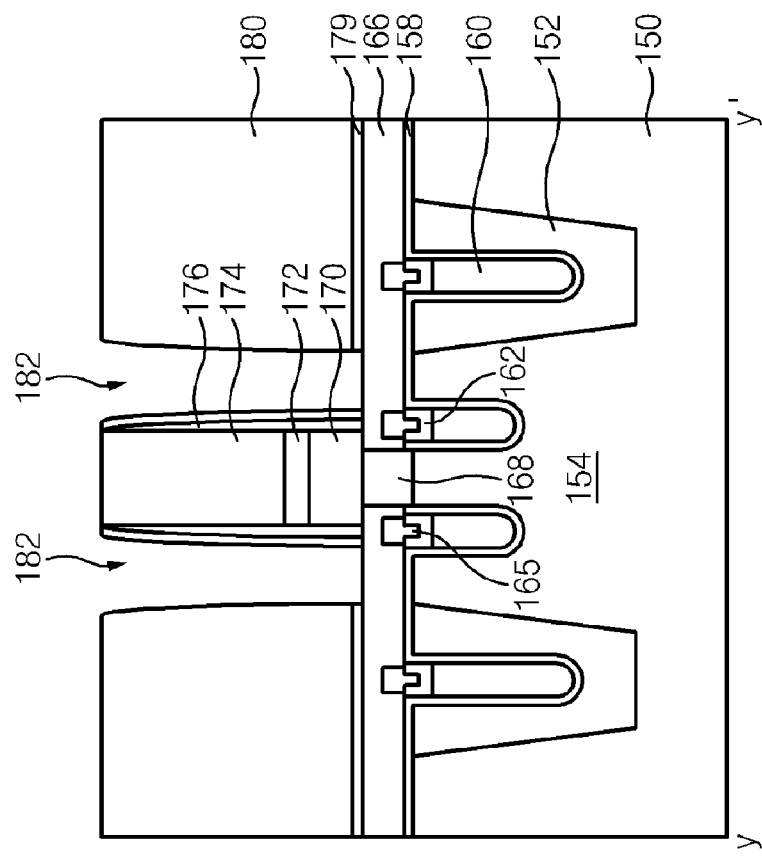
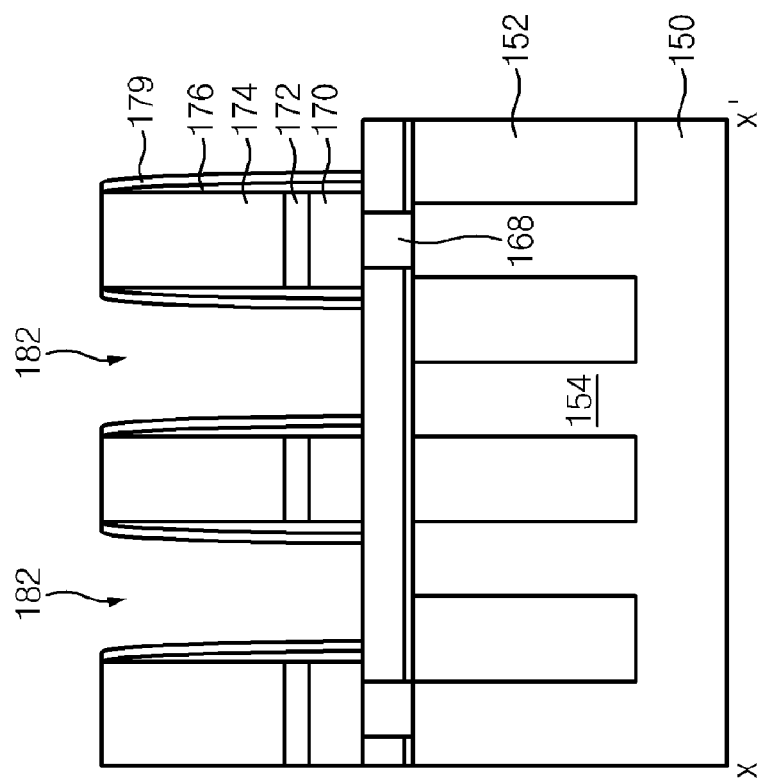
Fig. 6j

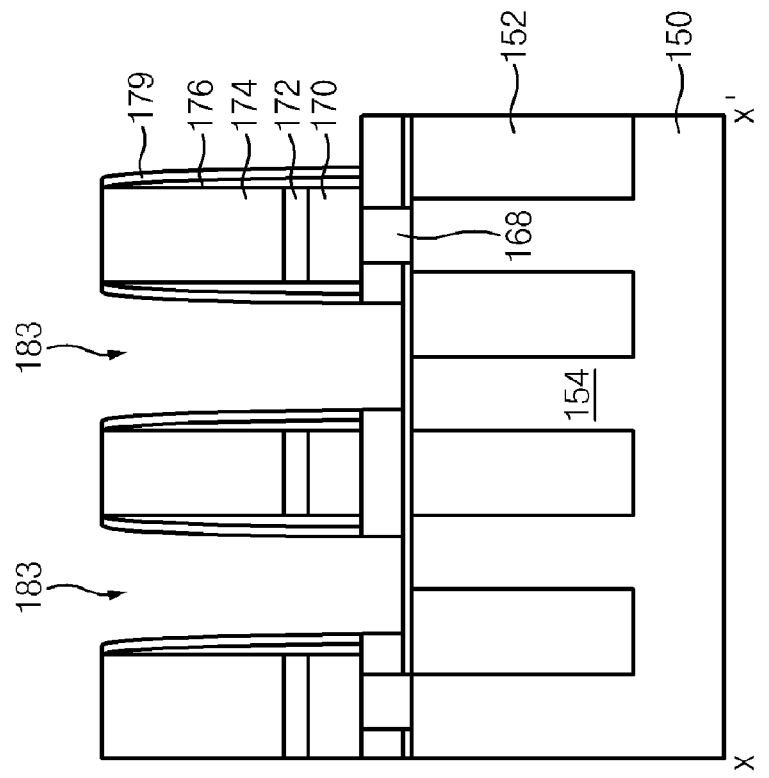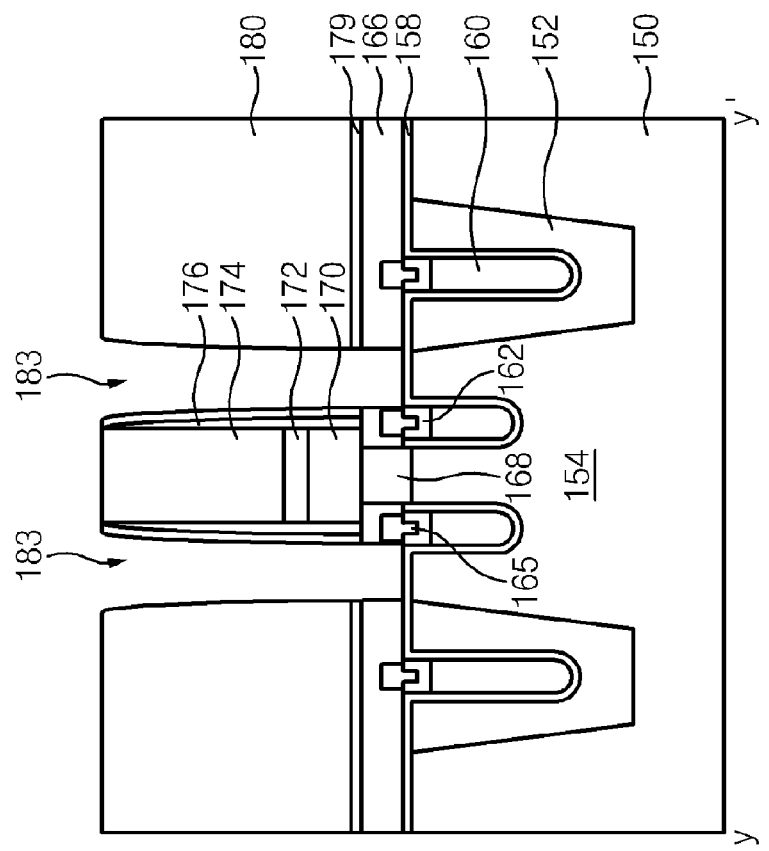
Fig. 6k

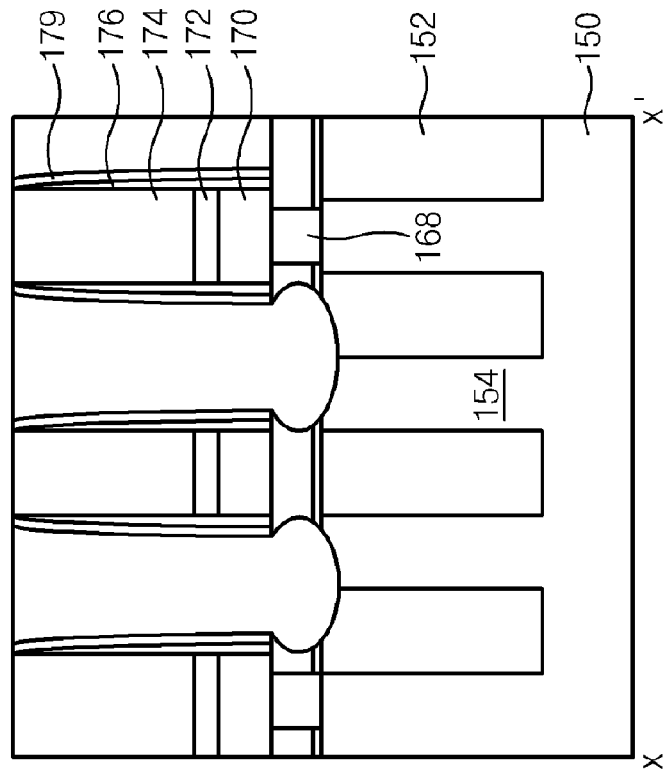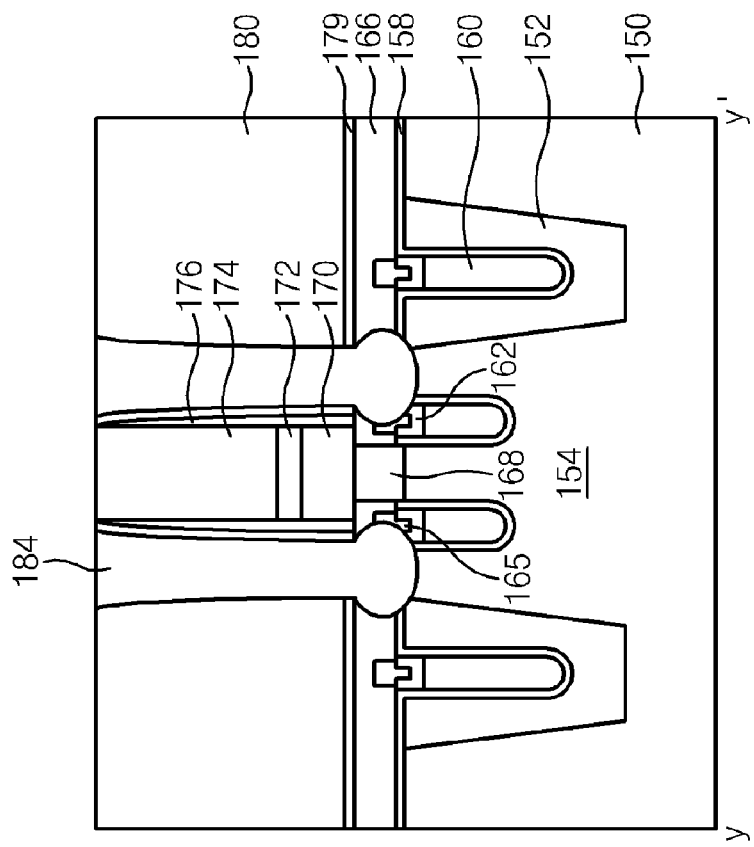
Fig. 6m

SEMICONDUCTOR DEVICE AND METHOD FOR FORMING THE SAME

CROSS-REFERENCE TO RELATED APPLICATION

The priority of Korean patent application No. 10-2009-0058724 filed on Jun. 30, 2009, the disclosure of which is hereby incorporated in its entirety by reference, is claimed.

BACKGROUND OF THE INVENTION

The present invention relates to a method for forming a semiconductor device, and more particularly to a method for forming a semiconductor device including a buried gate.

Recently, many electronic appliances include semiconductor devices. Semiconductor devices include electronic elements, such as transistors, resistors, capacitors, and the like. These electronic elements are designed to perform functions of the electronic appliance and are integrated on a semiconductor substrate. For example, electronic appliances, such as computers, digital cameras, and the like, include semiconductor devices, such as memory chips for storage of information, processing chips for control of information, and the like. The memory chips and processing chips include electronic elements integrated on a semiconductor substrate.

The degree of integration of the semiconductor device has been increasing in order to satisfy consumer demands for superior performance and low prices. Such an increase in the integration degree of a semiconductor device entails a reduction in a design rule, causing patterns of a semiconductor device to be increasingly reduced. Although an entire chip area is increased in proportion to an increase in a memory capacity as a semiconductor device is becoming super miniaturized and highly integrated, a cell area where patterns of a semiconductor device are actually formed is decreased. Accordingly, since a greater number of patterns need to be formed in a limited cell area in order to achieve a desired memory capacity, there is a need for formation of microscopic patterns having a reduced critical dimension.

Nowadays, various methods for forming microscopic patterns have been developed, including, a method using a phase shift mask as a photo mask, a Contrast Enhancement Layer (CEL) method in which a separate thin film capable of enhancing image contrast is formed on a wafer, and a Tri Layer Resist (TLR) method in which an intermediate layer, such as, a Spin On Glass (SOG) film, is interposed between two photoresist films.

Meanwhile, a contact for connecting upper and lower conductive lines to each other is significantly affected by a design rule, as compared to line and space patterns. In more detail, an increase in the integration degree of a semiconductor device causes a reduction in a size of a contact and space between the contact and the neighboring conductive line. This causes an increase in an aspect ratio of the contact, that is, a ratio of a diameter to a depth of the contact. Therefore, a contact forming process holds an important position in a method for forming a highly integrated semiconductor device. Accordingly, in a highly integrated semiconductor device having multilayered conductive lines, a contact forming process may require a precise and strict mask alignment, entailing a reduction in process margin. This may cause a difficulty in manufacturing the semiconductor device with this lowered process margin.

In particular, a Self Align Contact (SAC) fail occurs between a landing plug and a gate or between a landing plug and a recess gate in a landing plug process, resulting in a reduced production yield. Therefore, there is proposed an improved technology for changing the gate or the recess gate structure to a buried gate structure to prevent the SAC fail from being generated between the recess or the recess gate structure and the landing plug.

However, the buried gate structure also has a disadvantage in that it causes the SAC fail between a storage electrode contact and a bit line, or the storage electrode contact is not connected to an active region.

BRIEF SUMMARY OF THE INVENTION

Various embodiments of the present invention are directed to providing a semiconductor device and a method for forming the same that substantially obviate one or more problems due to limitations and disadvantages of the related art. One embodiment of the present invention provides a method for forming a semiconductor device including a buried gate, such that it prevents the buried gate from being easily oxidized and thus unique characteristics of the buried gate are not easily deteriorated.

In accordance with an aspect of the present invention, a method for forming a semiconductor device includes forming a buried gate on a semiconductor substrate including an active region, forming an insulating layer on the semiconductor substrate, selectively removing the insulating layer from at least an upper part of the active region, forming a bit line on an upper part between the buried gates formed on the active region, and forming a storage electrode contact plug that is adjacent to the bit line and has an extended lower part. As a result, the embodiments of the present invention can prevent the buried gate from being oxidized, and extend a lower part of the storage electrode contact hole, such that a storage electrode contact plug can be easily formed.

Preferably, the selectively removing of the insulating layer may include forming a photoresist pattern that exposes a cell area using an exposure mask for opening the cell area of the semiconductor substrate and performing an etch back process on the insulating layer using the photoresist pattern as an etch mask.

Preferably, the method may further include, after forming the photoresist pattern, performing a planarization etching process on the insulating layer exposed by the photoresist pattern.

Preferably, the selectively removing of the insulating layer may include forming a photoresist pattern that exposes at least the upper part of the active region on the insulating layer, and etching the insulating layer using the photoresist pattern as an etch mask.

Preferably, the selectively removing of the insulating layer may include forming a photoresist pattern on the insulating layer using an exposure mask that includes a shielding pattern having a width smaller than that of the buried gate, and etching the insulating layer using the photoresist pattern as an etch mask.

Preferably, the forming of the buried gate may include forming a buried gate reserved area on the semiconductor substrate, burying a conductive material for gate in the buried gate reserved area, and performing an etch-back process on the buried conductive material, and forming a capping nitride layer on the etched-back conductive material for gate.

Preferably, the forming of the bit line may include forming a first interlayer insulating layer including a bit line contact plug on the active region located between the buried gates, forming a bit line electrode, a first nitride layer, and a hard mask layer on the first interlayer insulating layer, the bit line electrode contacting the bit line contact, etching the hard mask layer, the first nitride layer, the bit line electrode, and the insulating layer to define a bit line structure, forming a bit line spacer on a sidewall of the bit line structure.

Preferably, the forming of the bit line contact plug may include forming a first interlayer insulating layer on the semiconductor substrate, forming a photoresist pattern for defining the bit line contact hole on the first interlayer insulating layer, etching the first interlayer insulating layer using the photoresist pattern as an etch mask so as to expose the semiconductor substrate, and forming a conductive material for the bit line contact plug on an entire surface, and performing a planarization etch process on the conductive material so as to expose the first interlayer insulating layer.

Preferably, the forming of the storage electrode contact plug may include forming a second interlayer insulating layer on the semiconductor substrate including the bit line, a forming a photoresist pattern for defining the storage electrode contact hole on the second interlayer insulating layer, forming a storage electrode contact hole by etching the second interlayer insulating layer formed at both sidewalls of the bit line using the photoresist pattern as an etch mask to expose the semiconductor substrate enlarging a lower portion of the storage electrode contact hole so that the storage electrode contact hole is wider at its bottom than at its top, thereafter, providing conductive material within the storage electrode contact hole Preferably, the enlarging step may include a wet or dry etch.

Preferably, the forming of the bit line may include forming a first interlayer insulating layer including a bit line contact plug on the active region located between the buried gates, forming a bit line electrode, a first nitride layer, and a hard mask layer on the first interlayer insulating layer, etching the hard mask layer, the first nitride layer and the bit line electrode to define a bit line structure, and forming a bit line spacer on a sidewall of the bit line structure.

Preferably, the forming of the bit line contact plug may include forming a first interlayer insulating layer on the semiconductor substrate, forming a photoresist pattern for defining the bit line contact hole on the first interlayer insulating layer, etching the insulating layer using the photoresist pattern as an etch mask so as to expose the semiconductor substrate, and forming a conductive material for the bit line contact plug on an entire surface, and performing a planarization etch process on the conductive material so as to expose the insulating layer.

Preferably, the forming of the storage electrode contact plug may include forming a silicon nitride layer on the insulating layer including the bit line, forming a second interlayer insulating layer on the entire upper surface of the silicon nitride layer, forming a photoresist pattern defining a storage electrode contact hole on the second interlayer insulating layer, forming a first storage electrode contact hole using the photoresist pattern as an etch mask and also using the silicon nitride layer as an etch stop layer, etching the etch stop layer, etching the second interlayer insulating layer using the first storage electrode contact hole as an etch mask, and thus forming a second storage electrode contact hole, enlarging a lower portion of the second storage electrode contact hole so that the second storage electrode contact hole is wider at its bottom than at its top, thereafter, providing conductive material within the first storage electrode contact hole and the second storage electrode hole.

Preferably, the enlarging step includes a wet or dry etch.

In accordance with another aspect of the present invention, a semiconductor device includes a buried gate buried in a semiconductor substrate including an active region, an insulating layer formed on the buried gate, a bit line formed on an upper part between the buried gates formed on the active region, and a storage electrode contact plug that is formed at both sides of the bit line and the storage electrode contact plug having a lower portion that is wider than its upper portion. As a result, the embodiments of the present invention prevent the buried gate from being oxidized, and provide a semiconductor device for generating no storage electrode contact resistance.

Preferably, the buried gate may include a gate electrode that is buried in a lower part of an etched buried gate reserved area in the semiconductor substrate, and a capping nitride layer that is formed on the gate electrode and is buried in the buried gate reserved area.

Preferably, the insulating layer may be formed on the capping nitride layer and be buried in the buried gate reserved area.

Preferably, the bit line may include a bit line contact plug formed on the active region between the buried gates, a first interlayer insulating layer pattern formed at sidewalls of the bit line contact plug, a laminated structure including a bit line electrode, a first nitride layer, and a hard mask layer, the laminated structure being provided on the bit line contact plug and the first interlayer insulating pattern, and a bit line spacer formed at sidewalls of the laminated structure and the first interlayer insulating layer pattern.

Preferably, the insulating layer may be formed on the capping nitride layer and be narrower than the buried gate.

Preferably, the bit line may include a bit line contact plug formed on the active region between the buried gates, a first interlayer insulating layer pattern formed at sidewalls of the bit line contact plug, a laminated structure including a bit line electrode, a first nitride layer, and a hard mask layer, the laminated structure provided over the first interlayer insulating layer pattern and the bit line contact plug and a bit line spacer formed a sidewall of the laminated structure.

Preferably, the semiconductor device may further include a storage electrode contact spacer formed on a sidewall of the bit line spacer.

BRIEF DESCRIPTION OF THE DRAWINGS

FIGS. 2A to 2J are cross-sectional views illustrating methods for forming the semiconductor device shown in FIG. 1 according to an embodiment of the present invention.

FIGS. 4A to 4L are cross-sectional views illustrating methods for forming the semiconductor device shown in FIG. 3 according to one embodiment of the present invention.

FIGS. 6A to 6M are cross-sectional views illustrating methods for forming the semiconductor device shown in FIG. 5 according to another embodiment of the present invention.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

An embodiment of the present invention may include a process for depositing an insulating layer twice on a buried gate. The two deposition process of the insulating layer can prevent a buried gate from being oxidized, and also prevent a seam defect of the insulating layer formed on the buried gate. Also, the present invention provides a larger storage electrode contact area for the buried gate the storage electrode contact to be formed easier by expanding a lower part of a storage electrode contact hole.

Figure 1:
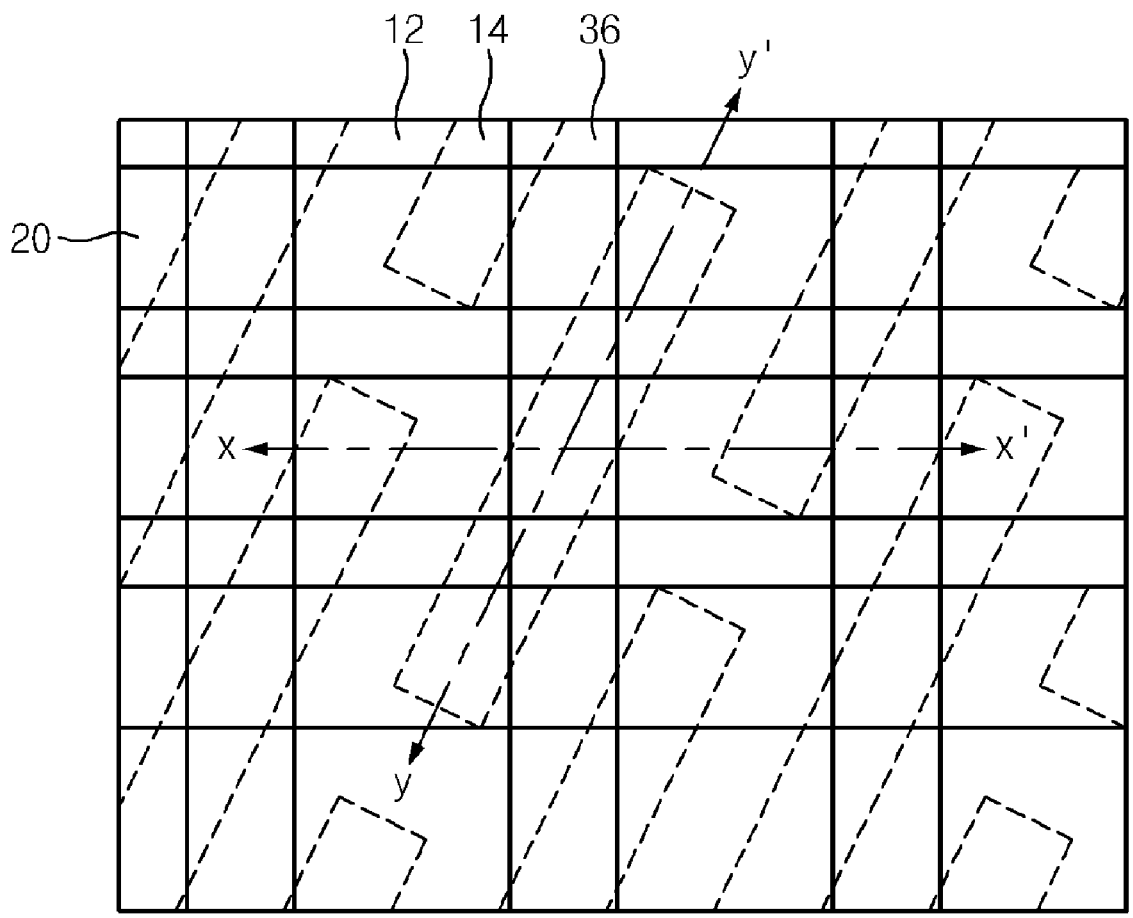
FIG. 1 is a plan view illustrating a semiconductor device according to an embodiment of the present invention.

FIG. 1 is a plan view illustrating a semiconductor device according to embodiments of the present invention. FIGS. 2A to 2J are cross-sectional views illustrating methods for forming a semiconductor device according to embodiments of the present invention. Herein, FIGS. 2A to 2F are cross-sectional views illustrating a semiconductor device taken along the line y-y' of FIG. 1.

Figure 2A:
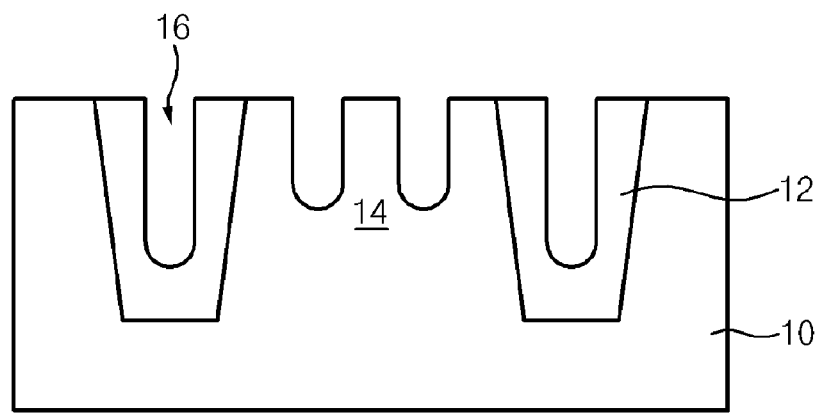

Referring to FIG. 2A, a buried gate reserved area (or a trench) 16 is formed in a semiconductor substrate including an active region 14 defined by a device isolation layer 12.

Figure 2B:
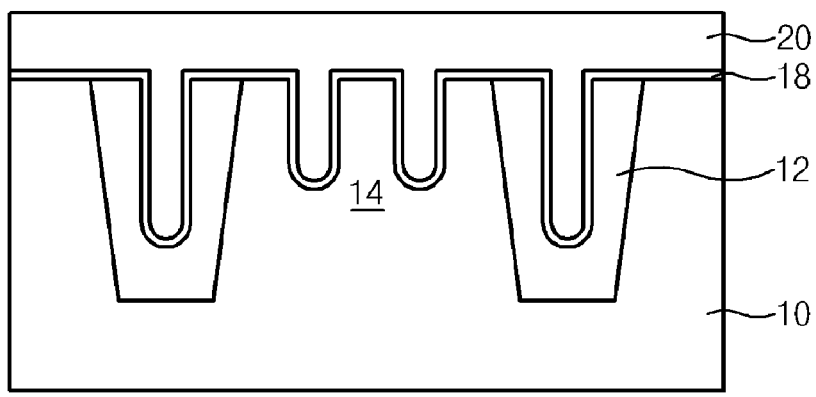
Figure 2C:
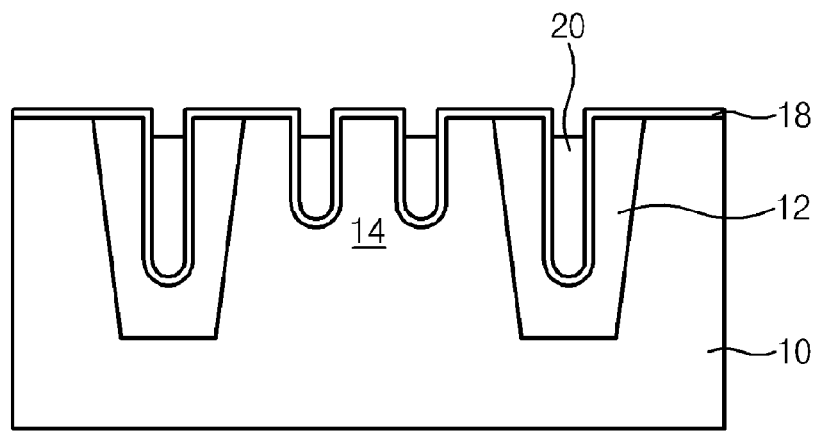
Figure 2D:
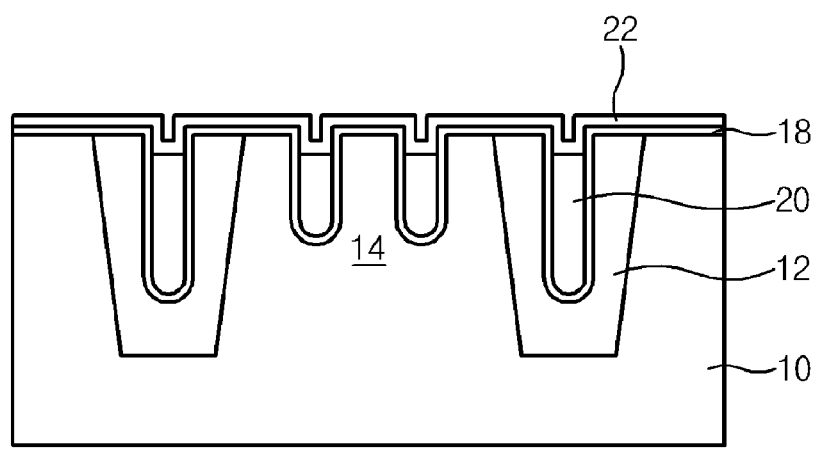
Figure 2E:
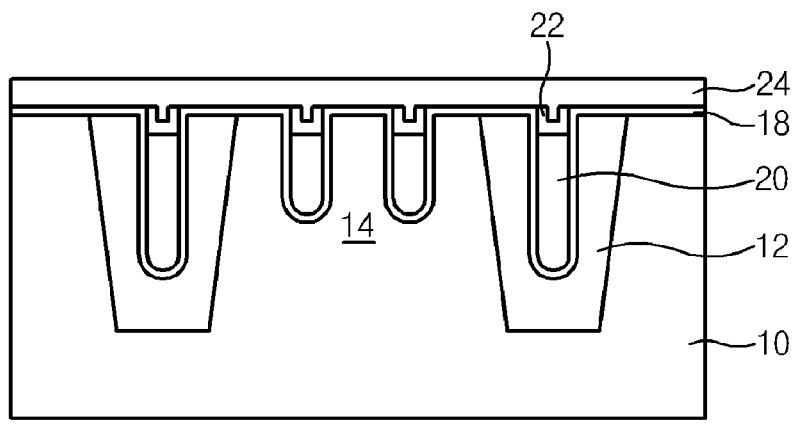
Figure 2F:
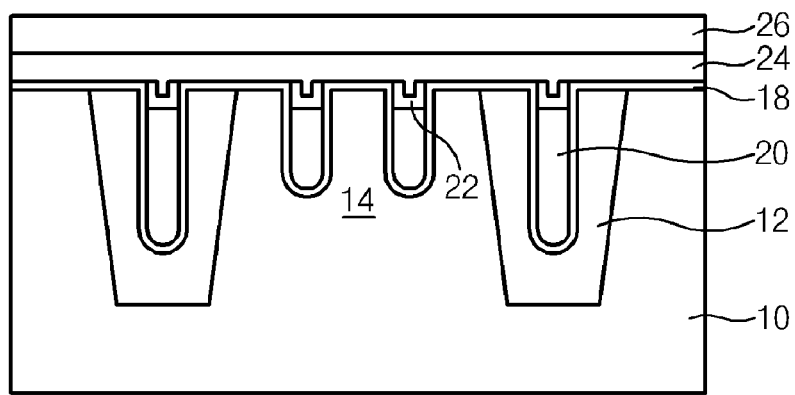

Referring to FIG. 2B, an oxide layer 18 is deposited on the entire surface of the semiconductor device, and a gate electrode 20 is deposited on the entire surface including on the oxide layer 18. In this case, the gate electrode 20 is deposited on the entire surface so as to allow the trench 16 to be filled. The gate electrode 20 may be formed of tungsten having a low resistance.

Referring to FIGS. 2C to 2F, an etch-back process is performed on the gate electrode 20 at least until the oxide layer 18 is exposed including a certain depth of the trench 16. This allows the trench 16 to be partially filled with the gate electrode 20 (see FIG. 2C). Next, a capping nitride layer 22 is formed on the entire surface including the etched-back gate electrode 20 (see FIG. 2D). Subsequently, the capping nitride layer 22 is planarized to expose the oxide layer 18, and a sealing nitride layer 24 is deposited on the capping nitride layer 22 (see FIG. 2E). In this case, the present invention is not limited to the sealing nitride layer 24, but other insulating layers such as an oxide layer and the like can be used. For convenience of description and better understanding of the present invention, the insulating layer such as the oxide layer may also be called only the sealing nitride layer. In this way, the capping nitride layer 22 is formed on the gate electrode 20, the sealing nitride layer 24 is deposited on the capping nitride layer 22 so as to be fully buried in an upper part of the gate electrode 20, so that generation of a seam defect can be prevented and thus a gate is not oxidized. Then, the first interlayer insulating layer 26 is deposited on the sealing nitride layer 24 (see FIG. 2F). In this case, the first interlayer insulating layer 26 may be formed of Tetra Ethyl Ortho Silicate (TEOS).

Figure 2H:
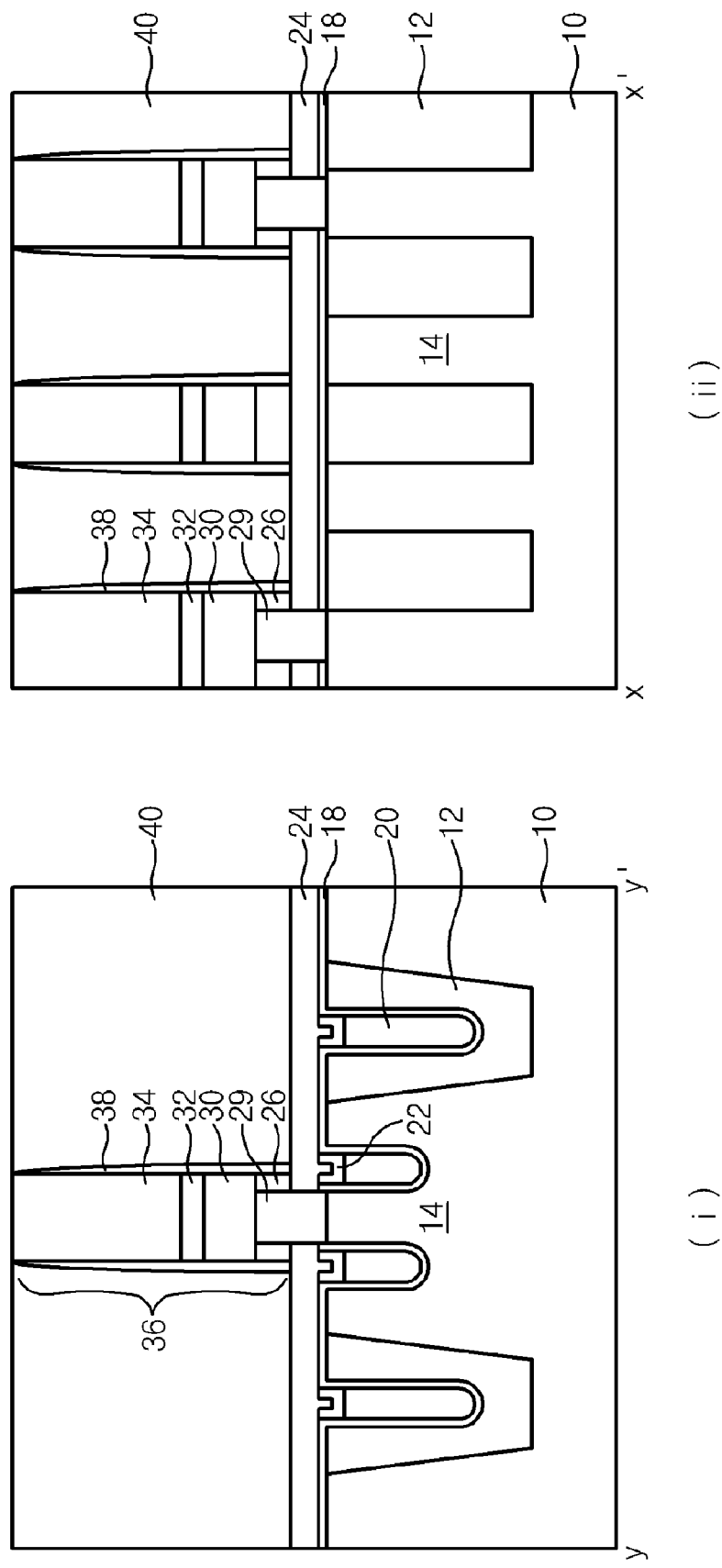
Figure 2I:
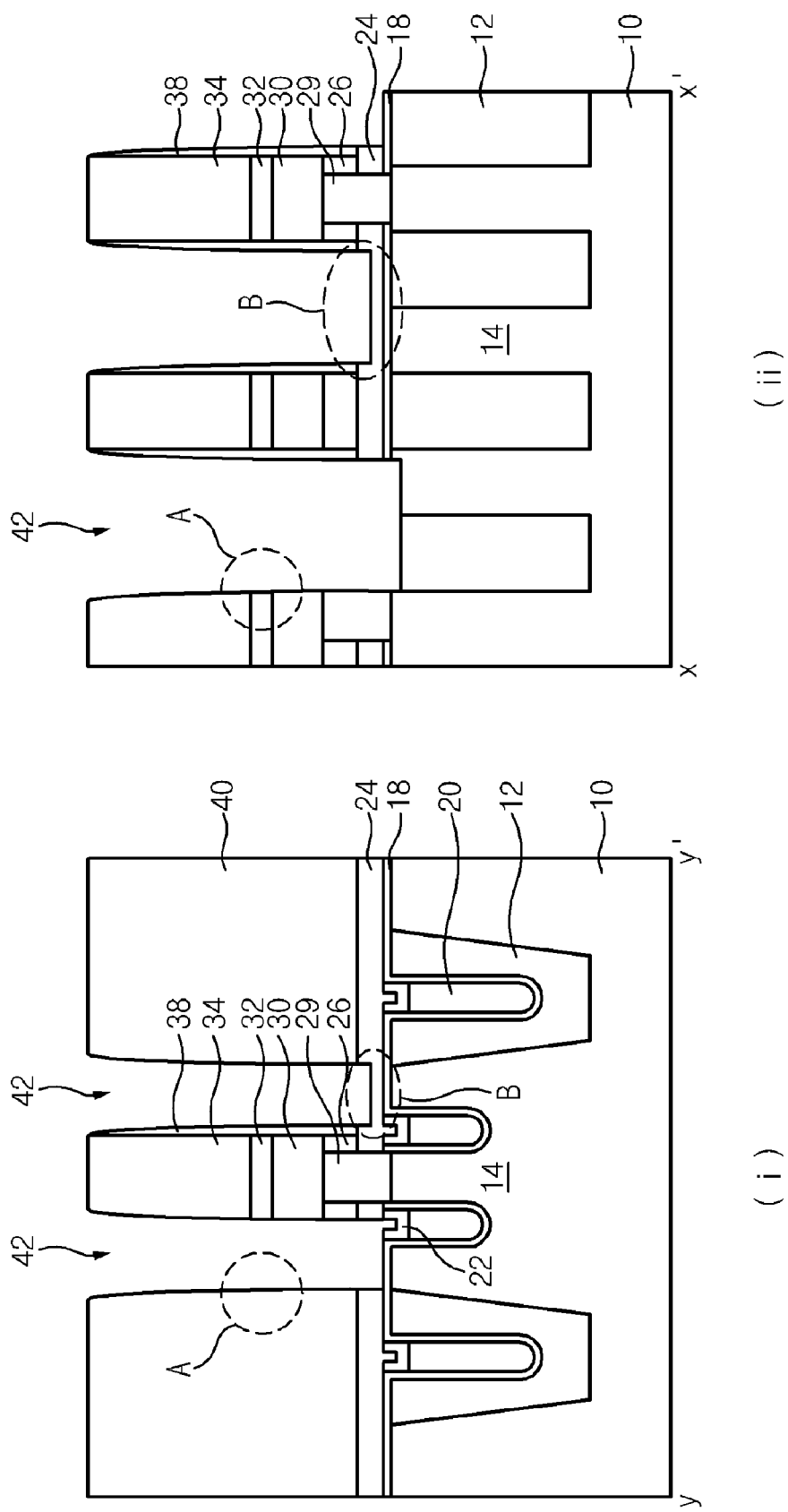

FIGS. 2G to 2I are cross-sectional views illustrating methods for forming a semiconductor device taken along the lines x-x' and y-y' of FIG. 1 according to embodiments of the present invention.

Referring to FIG. 2G, the first interlayer insulating layer 26, the sealing nitride layer 24, and the oxide layer 18 are etched using a photoresist pattern (not shown) for defining a bit line contact reserved area (not shown) as an etch mask so as to expose the active region 14. Subsequently, a polysilicon layer 28 is deposited on the entire surface including the bit line contact reserved area (not shown).

Referring to FIG. 2H, the polysilicon layer 28 is planarized to expose the first interlayer insulating layer 26, so that the bit line contact 29 is formed. Then, a bit line electrode 30, a nitride layer 32, and a hard mask 34 are formed on the entire surface, and are patterned using a photoresist pattern (not shown) defining the bit line as an etch mask so as to expose the sealing nitride layer 24, so that the bit line 36 is formed. In addition, a bit line spacer 38 is formed at sidewalls of the bit line 36. In this case, the bit line spacer 38 may be formed of a nitride layer. Thereafter, a second interlayer insulating layer 40 is formed on the entire surface, and is then planarized to expose the hard mask 34 of an upper part of the bit line. In this case, the second interlayer insulating layer 40 may be formed of BoroPhosphoSilicate Glass (BPSG).

Referring to FIG. 2I, a second interlayer insulating layer 40 is etched using a photoresist pattern (not shown) as an etch mask for defining a storage electrode contact hole 42, so that the storage electrode contact hole 42 is formed. In this case, a lower part of the storage electrode contact hole 42 may not be etched to the desired depth [e.g., only partially etched through the sealing nitride layer 24 left on the semiconductor substrate 10 (see "B" in FIG. 2I)]. Alternatively the lower part of the storage electrode contact hole 42 may be etched to the desired depth, but the sidewalls may be overetched [e.g., bit line spacer 38 is removed (see "A" in FIG. 2I)].

Therefore, as shown in FIG. 2J, in the case where a conductive material is buried in the storage electrode contact hole 42 so that the storage electrode contact 44 is formed, the storage electrode contact 44 and the bit line 36 may be short-circuited in an area A in which the bit line spacer 38 is over etched. In addition, a lower part of the storage electrode contact 44 is not connected to the active region 14 in an area B in which a nitride layer 24 is left on the lower part of the storage electrode contact hole 42, so that contact resistance may be increased. Therefore, the following embodiments may be carried out to correctly open the lower part of the storage electrode contact hole.

Figure 3:
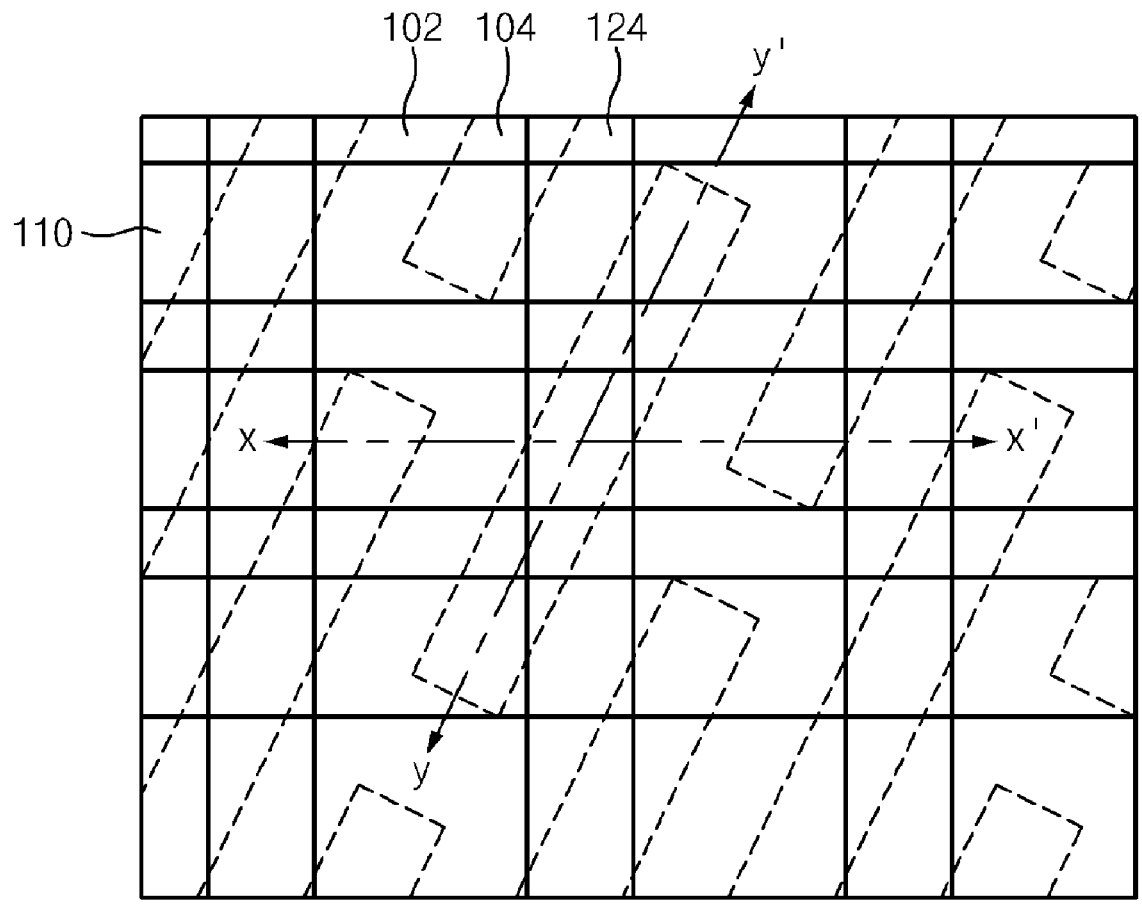
FIG. 3 is a plan view illustrating a semiconductor device according to one embodiment of the present invention.

FIG. 3 is a plan view illustrating a semiconductor device according to one embodiment of the present invention. FIGS. 4A to 4L are cross-sectional views illustrating methods for forming the semiconductor device shown in FIG. 3 according to one embodiment of the present invention.

Figure 4A:
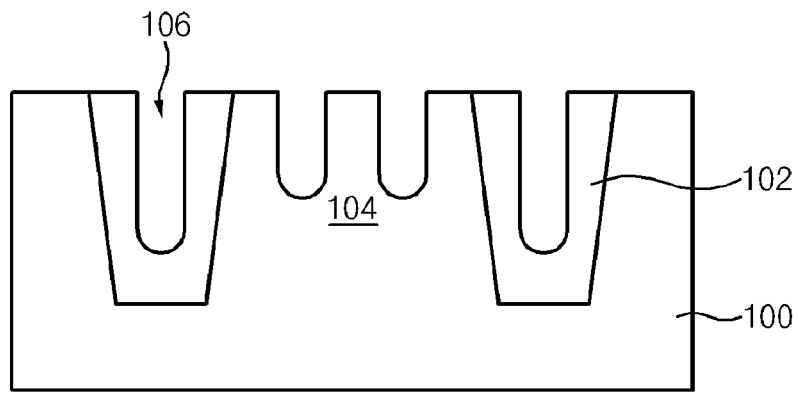

Referring to FIG. 4A, a trench 106 is formed on the semiconductor substrate 100 including the active region 104 defined as a device isolation layer 102. In this case, an oxide layer and a nitride layer may be added to the semiconductor substrate 100.

Figure 4B:
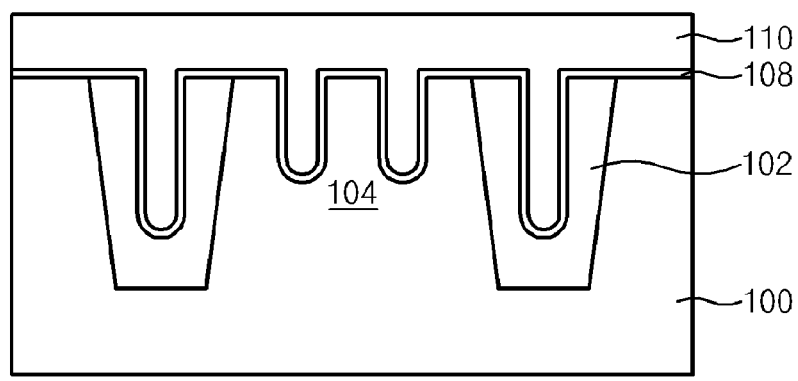
Figure 4C:
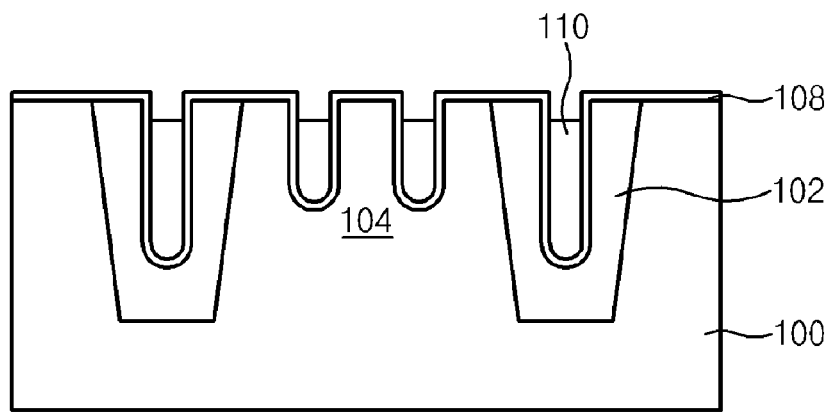
Figure 4D:
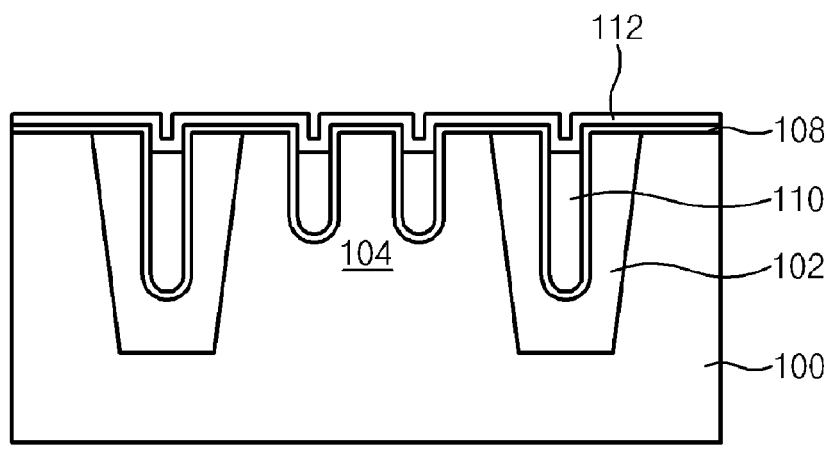
Figure 4E:
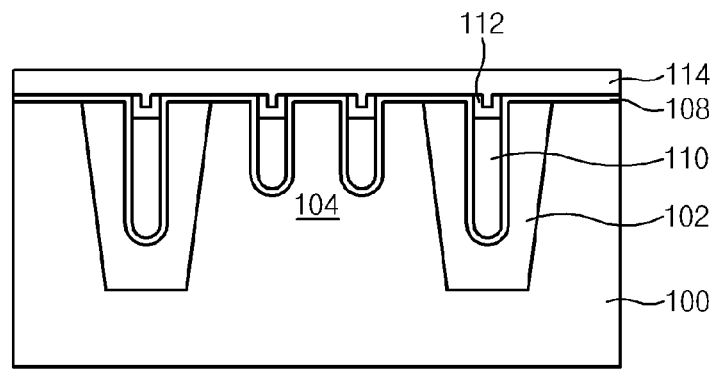
Figure 4F:
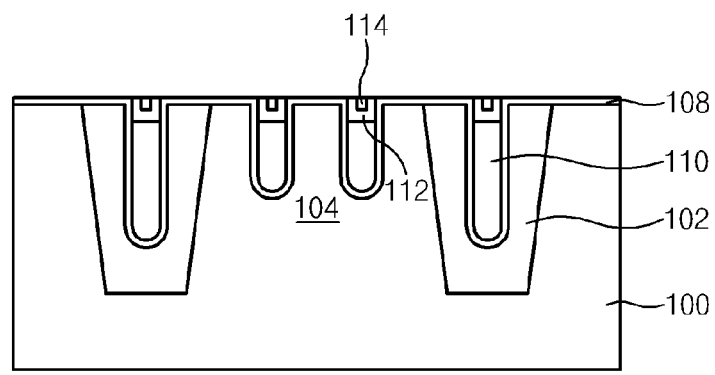

Referring to FIG. 4B, the oxide layer 108 is deposited on the entire surface, and the gate electrode 110 is deposited on the entire surface including the oxide layer 108. In this case, the gate electrode 110 is selectively deposited so that the trench 106 is buried with the gate electrode 110. In addition, the gate electrode 110 may be formed of tungsten, because tungsten has higher conductivity than polysilicon that is commonly used for gate material.

Figure 4G:
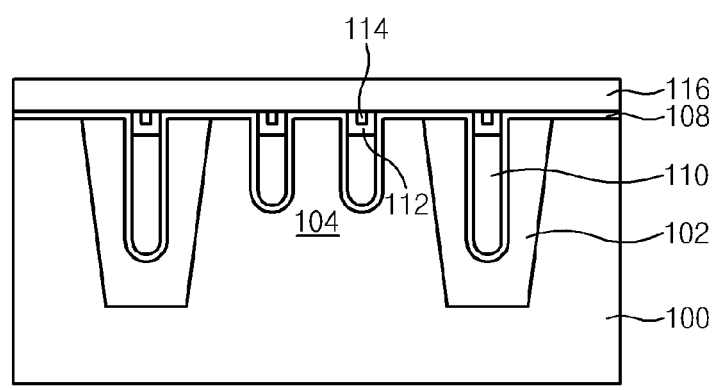

Referring to FIGS. 4C to 4F, an etch back process is performed on the gate electrode 110 until the oxide layer 108 is exposed including a certain depth of the trench 106. This allows the trench 106 to be partially filled with the gate electrode 110 while exposing an upper portion of the trench (see FIG. 4C). Subsequently, the capping nitride layer 112 is formed on the surface of the etched-back gate electrode 110 (see FIG. 4D). Then, the sealing nitride layer 114 is deposited on the capping nitride layer 112 (see FIG. 4E). Only the cell area is exposed using an exposure mask in which only the cell area is opened, and the sealing nitride layer 114 is then etched back so that the sealing nitride layer 114 of the cell area is removed, or the sealing nitride layer 114 is planarized until the oxide layer 108 is exposed (see FIG. 4F). As a result, the sealing nitride layer 114 provided outside of the trench 106 is removed, so that it can solve the post-process difficulty in that a lower part of the storage electrode contact hole is not etched deep enough. Thereafter, as shown in FIG. 4G, a first interlayer insulating layer 116 is deposited on the entire surface. Herein, the first interlayer insulating layer 116 may be formed of TEOS from among various oxide layers.

FIGS. 4H to 4L are cross-sectional views illustrating methods for forming a semiconductor device taken along the lines x-x' and y-y' of FIG. 3 according to embodiments of the present invention.

Referring to FIG. 4H, the first interlayer insulating layer 116 is etched using a photoresist pattern (not shown) for defining a bit line contact reserved area (or a bit line contact hole) as an etch mask so as to expose the active region 104. Subsequently, a polysilicon layer 118 is deposited on the entire surface including the bit line contact reserved area.

Figure 4K:
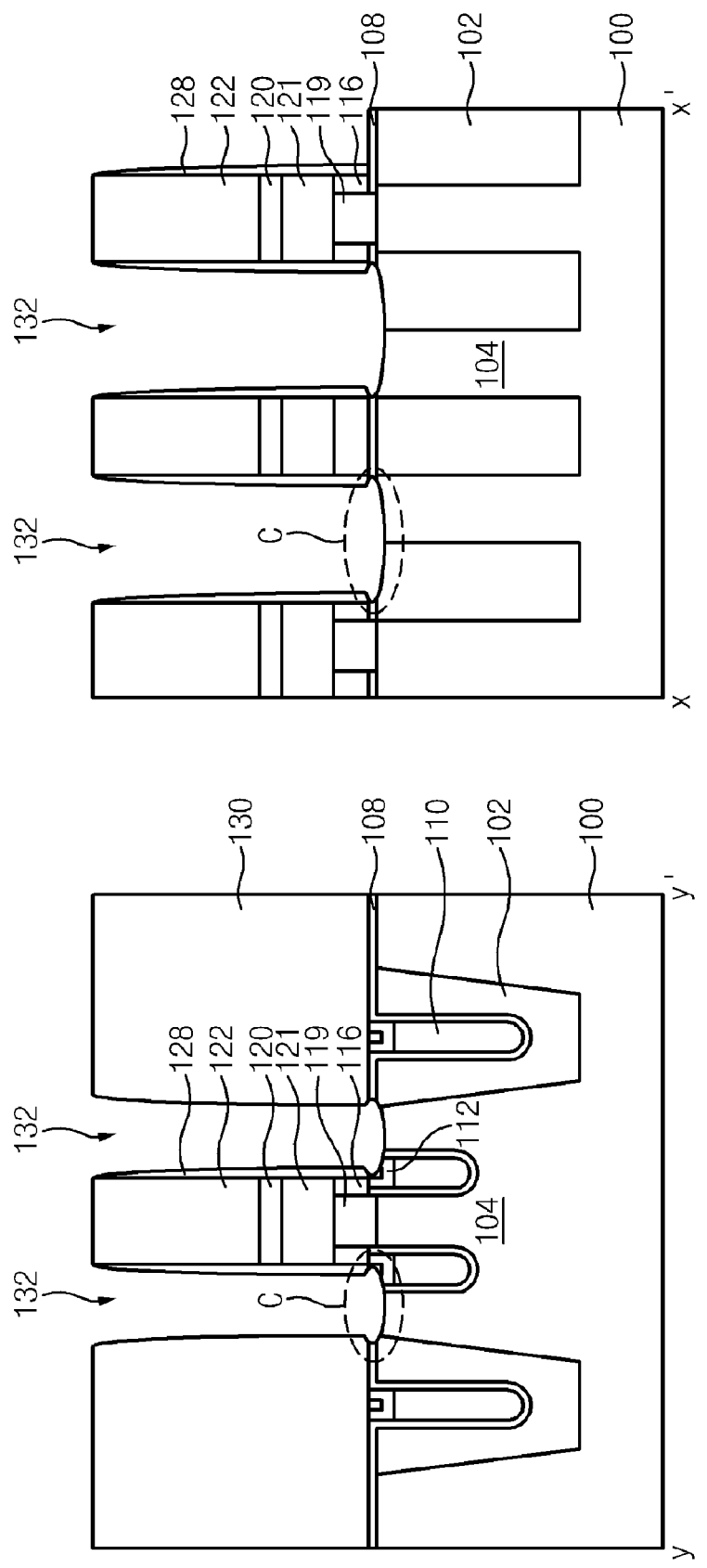
Figure 4I:
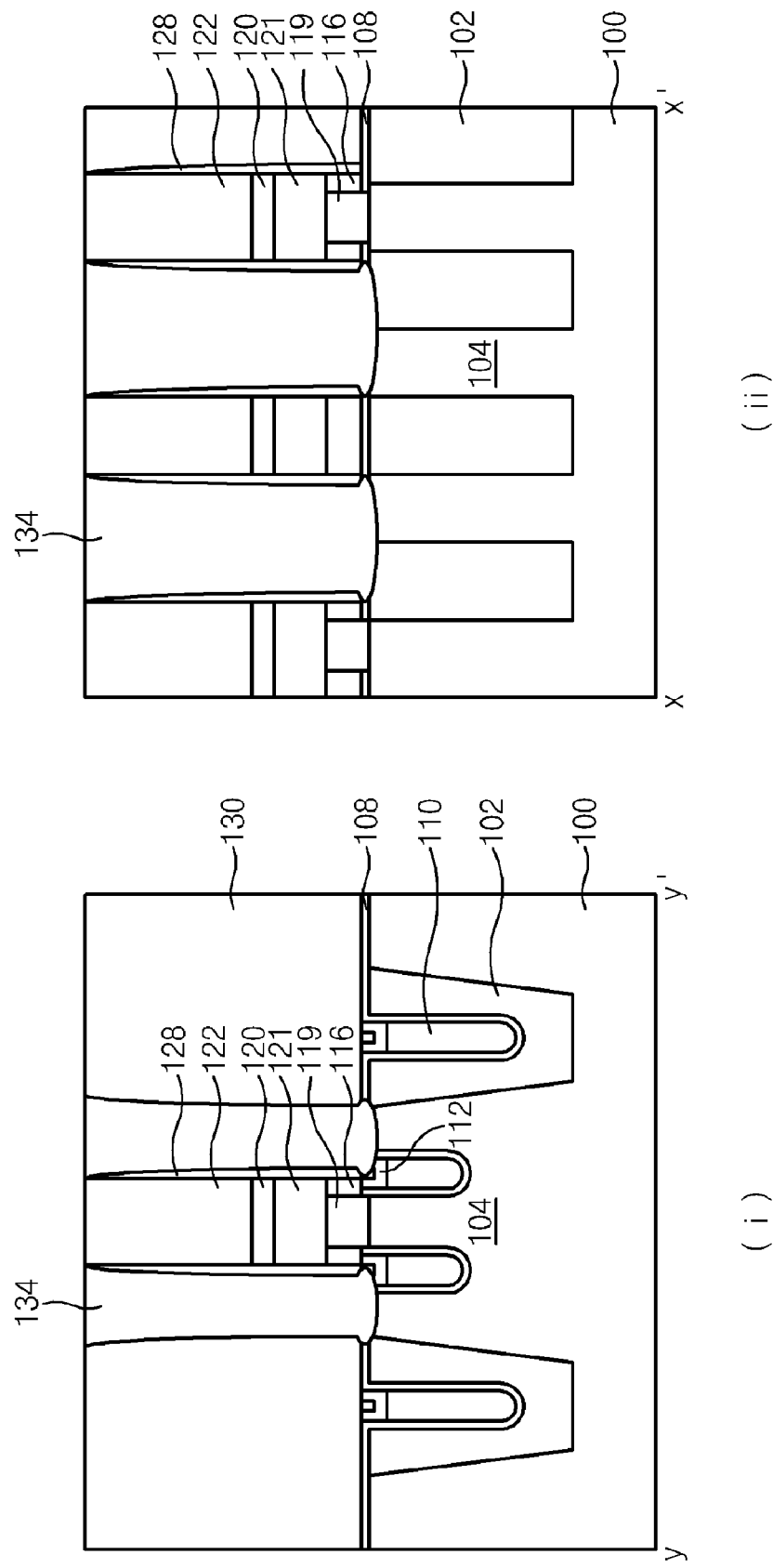

Referring to FIG. 4I, the polysilicon layer 118 is planarized to expose the first interlayer insulating layer 116, so that a bit line contact plug 119 is formed. Then, a bit line electrode 121, a nitride layer 120, and a hard mask 122 are formed on the entire surface, and are patterned using a photoresist pattern (not shown) defining the bit line as an etch mask so that a bit line 124 (or a bit line structure) is formed. In addition, a bit line spacer 128 is formed at sidewalls of the bit line 124. In this case, the bit line spacer 128 may be formed of a nitride layer. Thereafter, a second interlayer insulating layer 130 is formed on the entire surface, and is then planarized to expose the hard mask 122 serving as an upper part of the bit line. In this case, the second interlayer insulating layer 130 may be formed of BoroPhosphoSilicate Glass (BPSG).

Referring to FIGS. 4J and 4K, a second interlayer insulating layer 130 is etched using a photoresist pattern (not shown) as an etch mask for defining the storage electrode contact hole 132, so that a storage electrode contact hole 132 is formed (see FIG. 4J). In this case, the second interlayer insulating layer 130 is etched using a high etch selectivity ratio of the second interlayer insulating layer 130 to the bit line spacer 128, so that the storage electrode contact hole 132 is formed. Thereafter, the an etching process is carried out so that the bottom of the storage electrode contact hole 132 is enlarged as shown in the area 'C' (see FIG. 4K). In the present embodiment, the etch step includes a wet etch or a dry etch step.

Referring to FIG. 4L, a conductive material is buried in the storage electrode contact hole 132 so that a storage electrode contact plug 134 is formed. In this case, by removing the sealing nitride layer 114 from the semiconductor substrate 100 the connection between the storage electrode contact plug 134 and active region can be improved. Also the contact resistance between the storage electrode contact plug 134 and active region can be decreased by the increased area 'C'.

Figure 5:
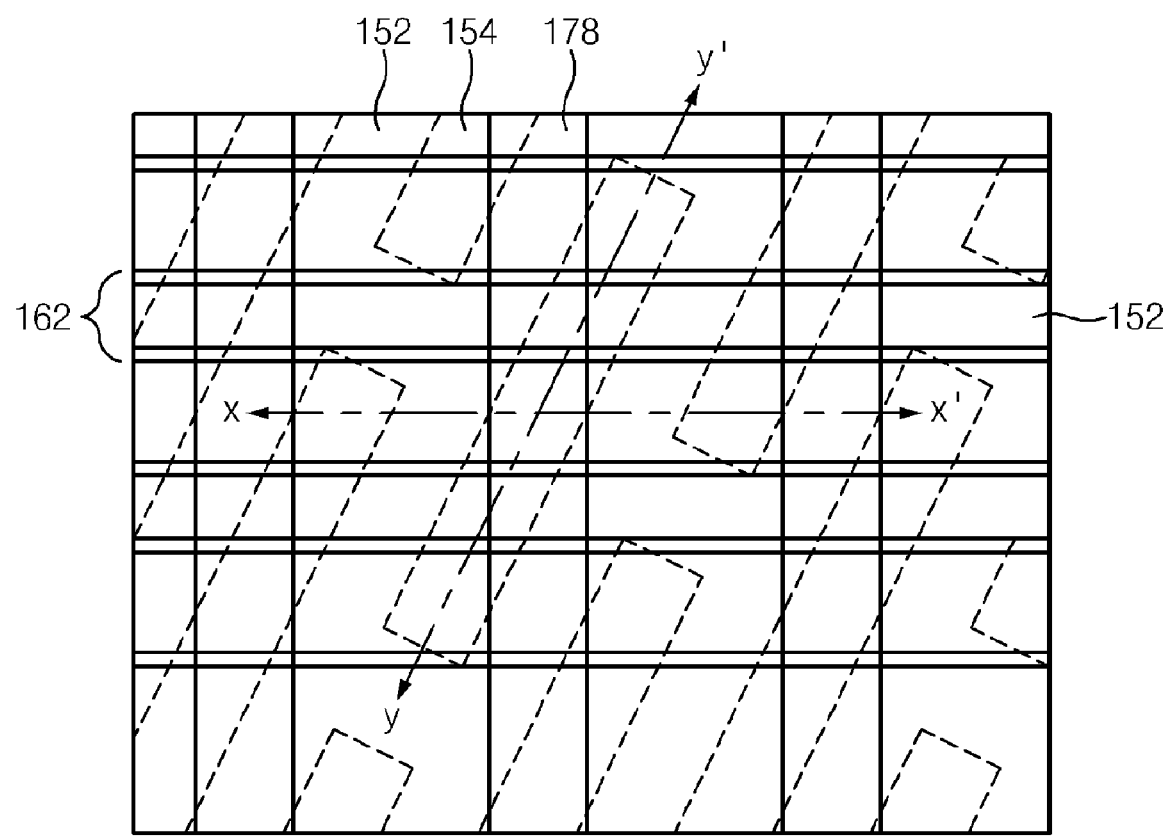
FIG. 5 is a plan view illustrating a semiconductor device according to another embodiment of the present invention.

FIG. 5 is a plan view illustrating a semiconductor device according to another embodiment of the present invention. FIGS. 6A to 6M are cross-sectional views illustrating methods for forming the semiconductor device shown in FIG. 5 according to another embodiment of the present invention.

Figure 6A:
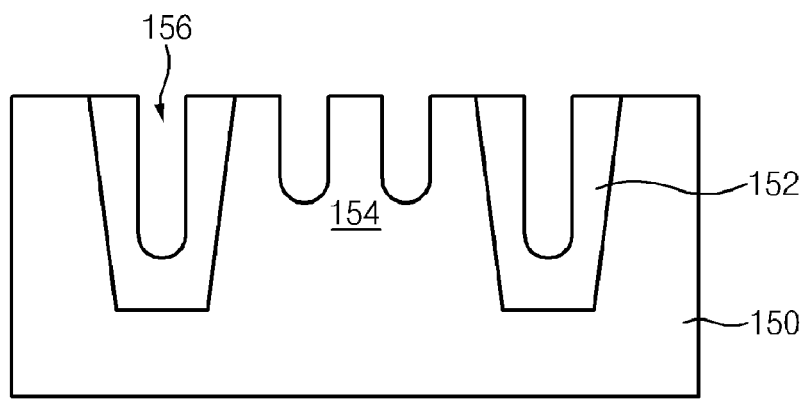

Referring to FIG. 6A, a trench 156 is formed on the semiconductor substrate 150 including an active region 154 defined as a device isolation layer 152. In this case, an oxide layer and a nitride layer are further formed on the semiconductor substrate 100.

Figure 6B:
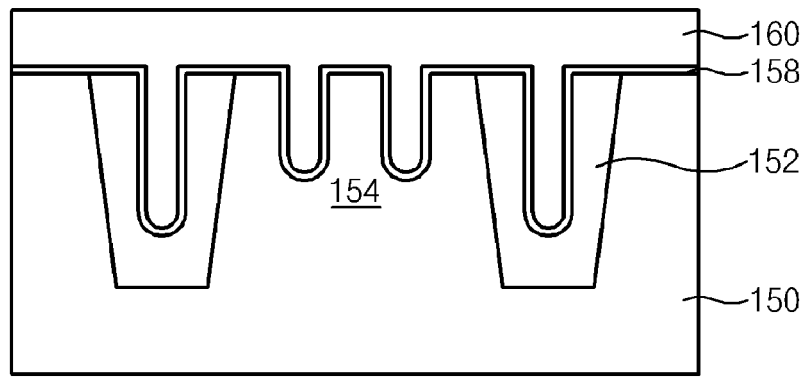

Referring to FIG. 6B, an oxide layer 158 is deposited on the entire surface, and a gate electrode 160 is deposited on the entire surface including the oxide layer 158. In this case, the gate electrode 160 may be selectively deposited so that the trench 156 is buried with the gate electrode 160. In addition, the gate electrode 160 may be formed of tungsten, because the tungsten can greatly reduce resistance of the gate electrode 160.

Figure 6C:
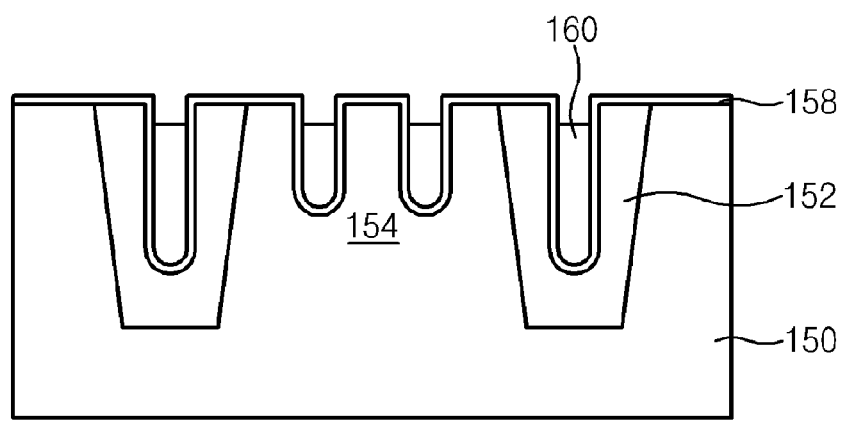
Figure 6D:
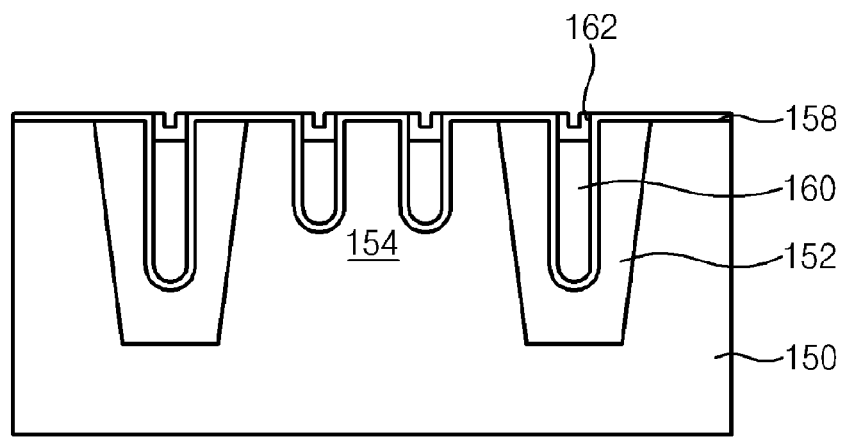
Figure 6E:
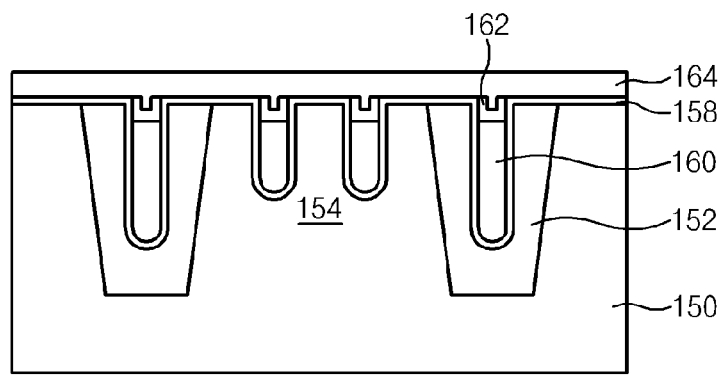

Referring to FIGS. 6C to 6E, an etch back process is performed on the gate electrode 160 until the oxide layer 158 is exposed including a certain depth of the trench 156. This allows the trench 156 to be partially filled with the gate electrode 160 while exposing an upper portion of the trench 156 (see FIG. 6C). Subsequently, the capping nitride layer 162 is formed on the surface of the etched-back gate electrode 160 (see FIG. 6D). Then, the sealing nitride layer 164 is deposited on the entire surface (see FIG. 6E).

Figure 6F:
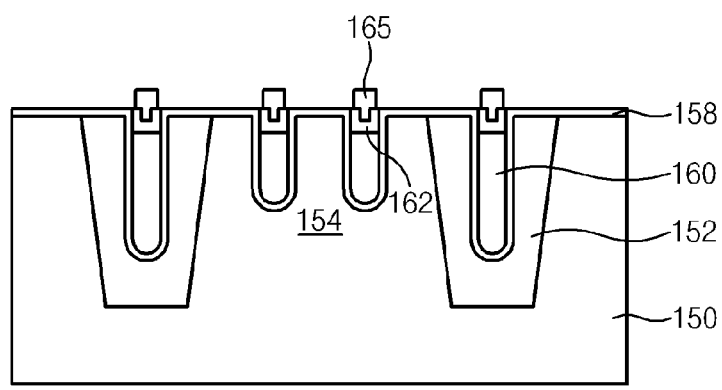

Referring to FIG. 6F, a photoresist layer (not shown) is deposited on the sealing nitride layer 164. An exposure and development process is then carried out using an exposure mask including a shielding pattern (not shown) having a width smaller than that of the buried gate 160, so that a photoresist pattern (not shown) is formed. The sealing nitride layer 164 is then etched using the photoresist pattern (not shown) as an etch mask, so that a nitride layer pattern 165 is formed. That is, the nitride layer pattern 165 is formed only on the buried gate 160, so that the nitride layer 164 can be completely removed in an area where a storage electrode contact will be formed in a subsequent process.

Figure 6G:
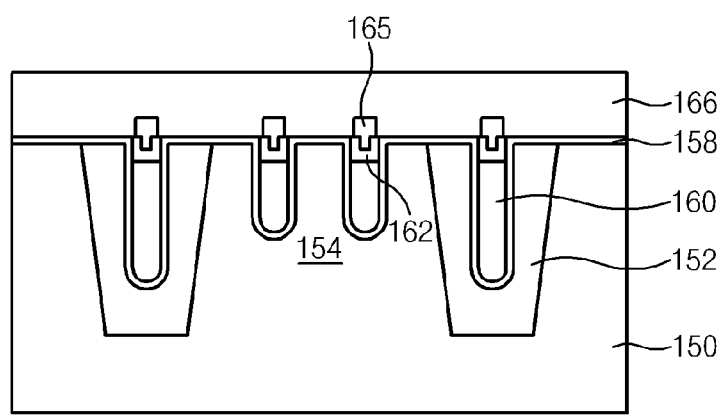

Referring to FIG. 6G, a first interlayer insulating layer 166 is deposited on the entire surface including the nitride layer pattern 165. In this case, the first interlayer insulating layer 166 may be formed of TEOS.

FIGS. 6H to 6M are cross-sectional views illustrating methods for forming a semiconductor device taken along the lines x-x' and y-y' of FIG. 5 according to embodiments of the present invention.

Figure 6H:
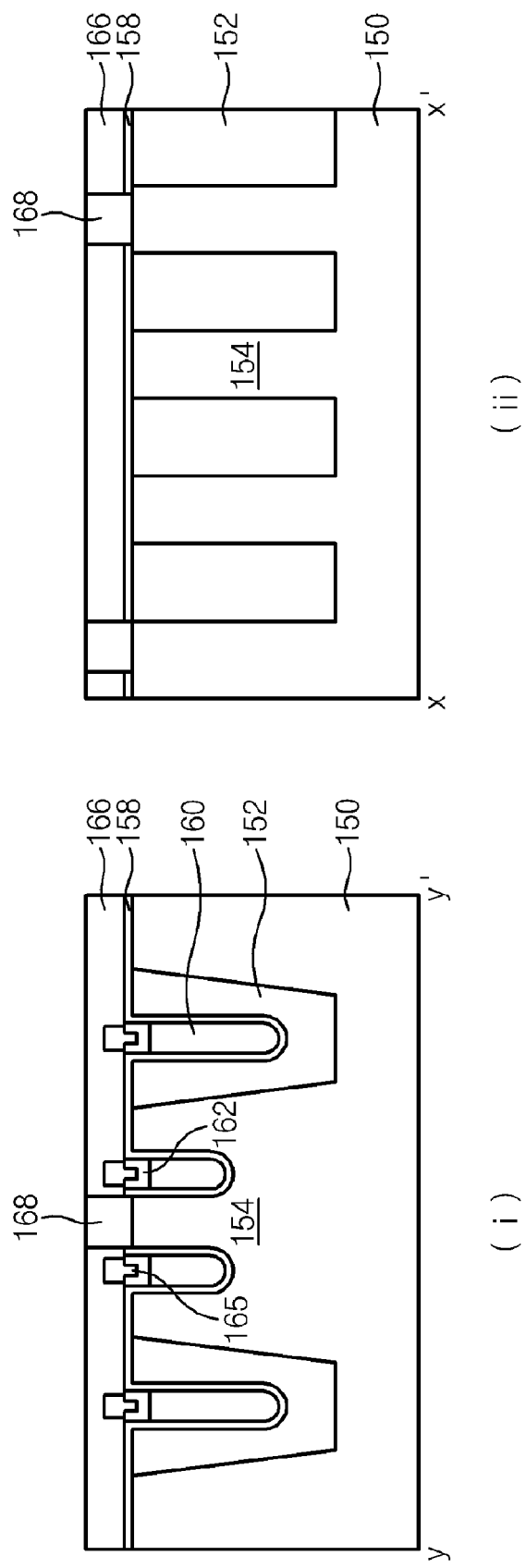

Referring to FIG. 6H, the first interlayer insulating layer 166 is etched using a photoresist pattern (not shown) for defining a bit line contact reserved area (not shown) as an etch mask so as to expose the active region 154. Subsequently, the polysilicon layer 168 may be planarized to expose the first interlayer insulating layer 166.

Figure 6I:
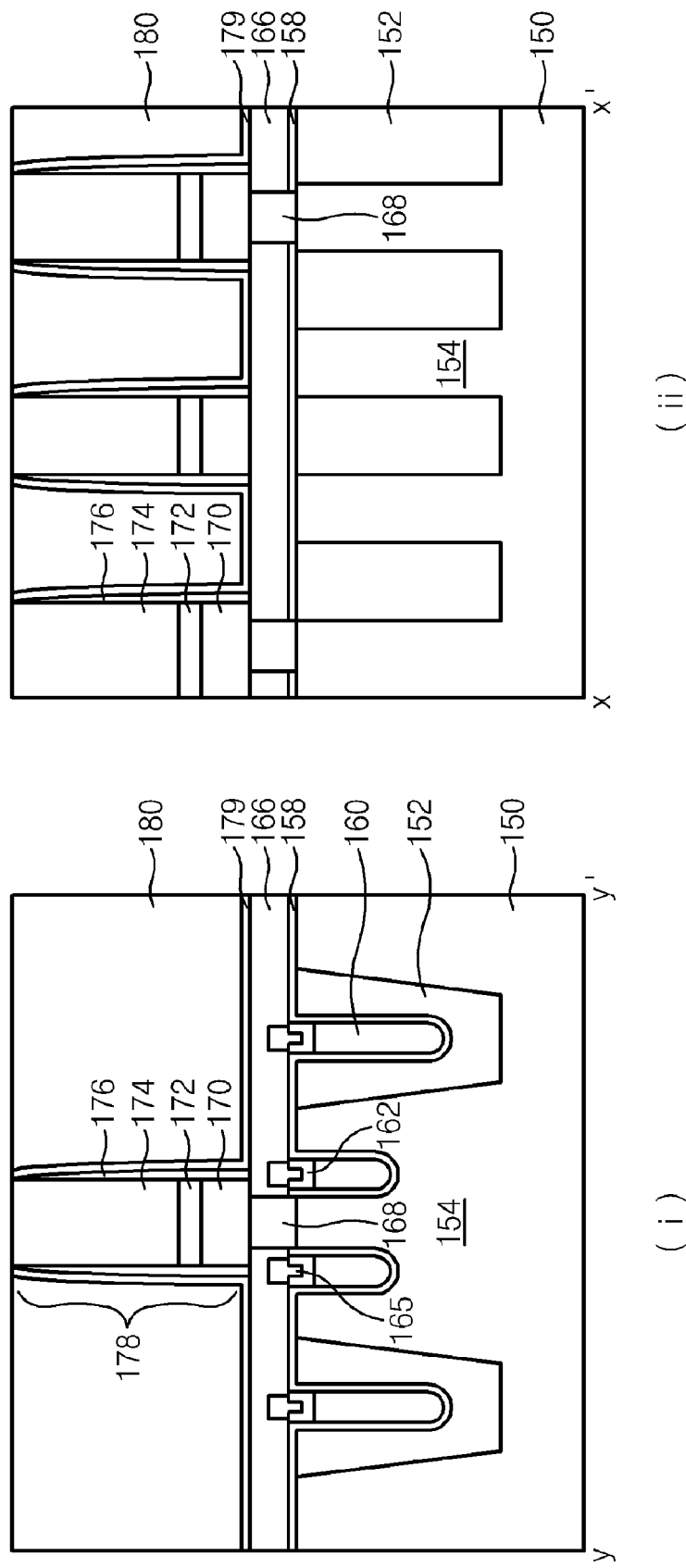
Figure 61:
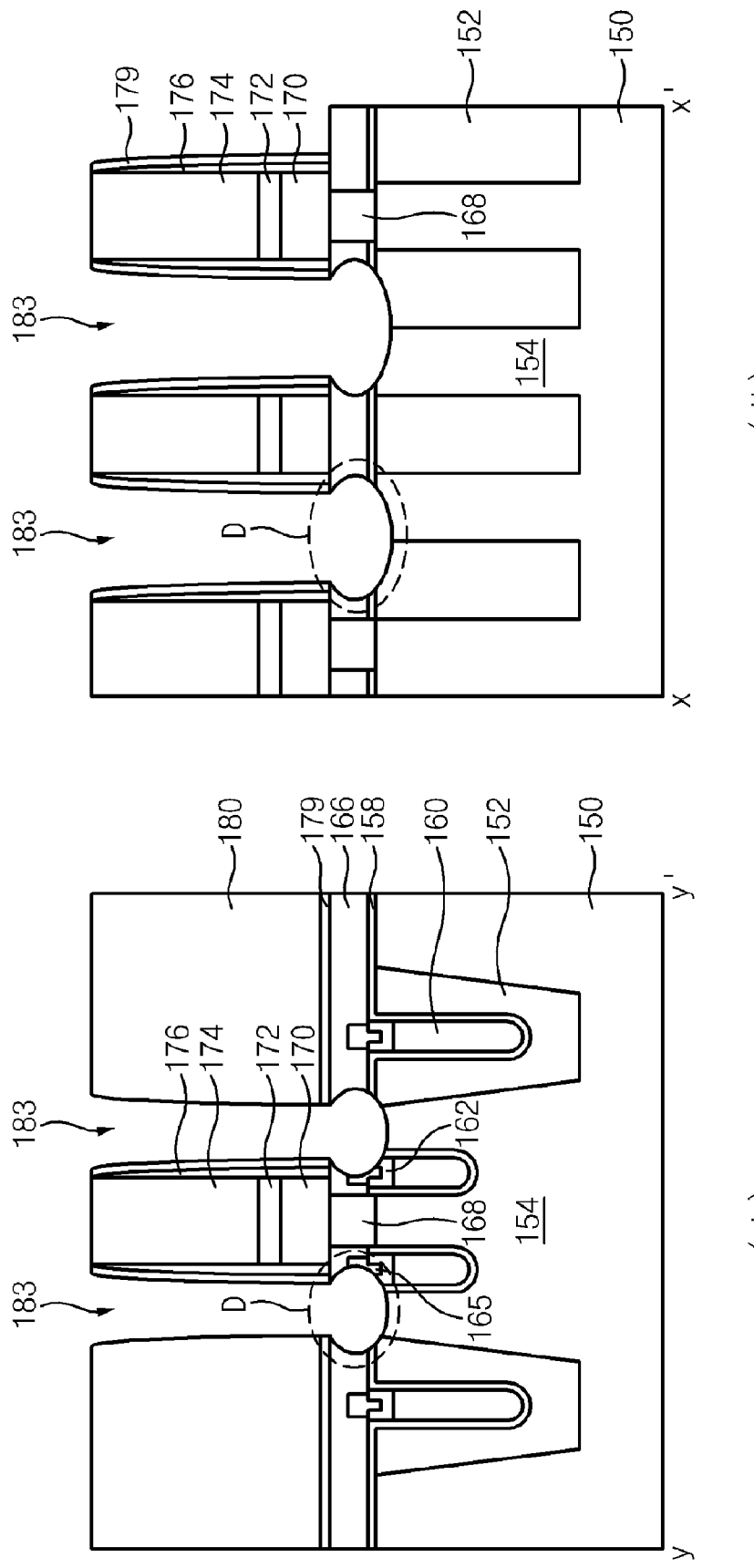

Referring to FIG. 6I, the bit line electrode 170, the nitride layer 172, and the hard mask 174 are formed on the entire surface, and are patterned using a photoresist pattern (not shown) for defining the bit line at an upper part of the hard mask 174 as an etch mask in such a manner that the first interlayer insulating layer 166 is exposed so that the bit line 178 is formed. The bit line spacer 176 is formed at sidewalls of the bit line 178. In this case, the bit line spacer 176 may be formed of a nitride layer. Thereafter, a silicon nitride (SiN) layer 179 is formed on the entire surface including the bit line 178. The second interlayer insulating layer 180 is formed on the entire surface, and the second interlayer insulating layer 180 is planarized to expose an upper part of the bit line. In this case, the second interlayer insulating layer 180 may be formed of BPSG.

Referring to FIG. 6J, the second interlayer insulating layer 180 is etched using a photoresist pattern (not shown) for defining the storage electrode contact hole as an etch mask and at the same time using the silicon nitride layer 179, so that the first storage electrode contact hole 182 is formed. In this case, the second interlayer insulating layer 180 is etched using high etch selectivity ratio of the second interlayer insulating layer 180 to the silicon nitride layer 179, so that the first storage electrode contact hole 182 is formed. And then the silicon nitride layer 179 over the bottom of the first storage electrode contact hole 182 is removed. In this case, the storage electrode contact spacer 179 is formed at sidewalls of the first storage electrode contact hole 182.

Referring to FIG. 6K, the first interlayer insulating layer 166 may be etched using the first storage electrode contact hole 182 as an etch mask, so that the second storage electrode contact hole 183 is formed.

Referring to FIG. 6L, the second storage electrode contact hole 183 is additionally etched. A first interlayer insulating layer 166 and oxide layer 158 are etched at the bottom of the second storage electrode contact hole 183, so that the bottom of the second storage electrode contact hole 183 is enlarged as shown in the area 'D' and thus the contact resistance can be improved.

Referring to FIG. 6M, a conductive material is buried in the storage electrode contact hole 182 so that a storage electrode contact plug 184 is formed. In this case, resistance of the storage electrode contact plug 184 is improved by the removal of the sealing nitride layer 164 from the upper part of the active region 104 and the increased storage electrode contact area.

As apparent from the above description, the method for forming the buried gate of the semiconductor device according to embodiments of the present invention can prevent the buried gate from being oxidized, prevent the short circuiting between a storage electrode contact and a bit line, and improve contact resistance by enlarging a contact area between a storage electrode contact and an active region, so that unique characteristics of the semiconductor device can be improved.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a semiconductor device comprising:
    forming neighboring buried gates on a semiconductor substrate including an active region;
    forming an insulating layer on the semiconductor substrate;
    selectively removing the insulating layer from at least a region over an upper part of the active region;
    forming a photoresist pattern to expose a cell area using an exposure mask for opening the cell area of the semiconductor substrate;
    etching the insulating layer using the photoresist pattern as an etch mask;
    forming a bit line on the upper part of the active region between the neighboring buried gates; and
    forming a storage electrode contact plug that is adjacent to the bit line and that has a laterally extending lower portion,
    wherein forming the bit line includes:
    forming a first interlayer insulating layer and a bit line contact plug on the active region between the neighboring buried gates;
    forming a bit line electrode, a first nitride layer, and a hard mask layer on the first interlayer insulating layer, the bit line electrode contacting the bit line contact plug;
    etching the hard mask layer, the first nitride layer, the bit line electrode, and the insulating layer to form a bit line structure; and
    forming a bit line spacer on a sidewall of the bit line structure.

2. The method according to claim 1, further comprising:
    after forming the photoresist pattern, performing a planarization etching process on the insulating layer exposed by the photoresist pattern.

3. The method according to claim 1, wherein forming the buried gate includes:
    forming a buried gate reserved area in the semiconductor substrate;
    providing a conductive material for a gate in the buried gate reserved area, and performing an etch-back process on the conductive material;
    forming a capping nitride layer over the etched-back conductive material.

4. The method according to claim 1, wherein forming the bit line contact plug includes:
    forming the first interlayer insulating layer on the semiconductor substrate;
    forming a photoresist pattern for defining a bit line contact hole on the first interlayer insulating layer;
    etching the first interlayer insulating layer using the photoresist pattern as an etch mask so as to expose the semiconductor substrate; and
    forming a conductive material for the bit line contact plug over an entire surface of the semiconductor substrate, and performing a planarization etch process on the conductive material so as to expose the first interlayer insulating layer.

5. The method according to claim 1, wherein forming the storage electrode contact plug includes:
    forming a second interlayer insulating layer over the semiconductor substrate including the bit line structure;
    forming a photoresist pattern for defining a storage electrode contact hole on the second interlayer insulating layer;
    forming the storage electrode contact hole by etching a portion of the second interlayer insulating layer formed at both sidewalls of the bit line using the photoresist pattern as an etch mask to expose the semiconductor substrate;
    enlarging a lower portion of the storage electrode contact hole so that the lower portion of the storage electrode contact hole is wider than an upper portion of the storage electrode contact hole; and
    providing a conductive material in the storage electrode contact hole.

6. The method according to claim 5, wherein the enlarging step includes a wet etch process or a dry etch process.

7. A method for forming a semiconductor device comprising:
    forming neighboring buried gates on a semiconductor substrate including an active region;
    forming an insulating layer on the semiconductor substrate;
    selectively removing the insulating layer from at least a region over an upper part of the active region;
    forming a bit line on the upper part of the active region between the neighboring buried gates; and
    forming a storage electrode contact plug that is adjacent to the bit line and that has a laterally extending lower portion,
    wherein selectively removing the insulating layer includes:
    forming a photoresist pattern to expose at least the region over the upper part of the active region on the insulating layer; and
    etching the insulating layer using the photoresist pattern as an etch mask, and
    wherein forming the bit line includes:
    forming a first interlayer insulating layer and a bit line contact plug on the active region between the neighboring buried gates;
    forming a bit line electrode, a first nitride layer, and a hard mask layer on the first interlayer insulating layer, the bit line electrode contacting the bit line contact plug;

etching the hard mask layer, the first nitride layer, and the bit line electrode to form a bit line structure; and forming a bit line spacer on a sidewall of the bit line structure.

8. The method according to claim 7, wherein forming the bit line contact plug includes:

forming a first interlayer insulating layer over the semiconductor substrate;

forming a photoresist pattern for defining the bit line contact hole on the first interlayer insulating layer;

etching the first interlayer insulating layer using the photoresist pattern as an etch mask so as to expose the semiconductor substrate; and forming a conductive material for the bit line contact plug over an entire surface of the semiconductor substrate, and performing a planarization etch process on the conductive material so as to expose the first interlayer insulating layer.

9. The method according to claim 7, wherein forming the storage electrode contact plug includes:

forming a silicon nitride layer on the insulating layer including the bit line;

forming a second interlayer insulating layer on the silicon nitride layer;

forming a photoresist pattern defining a storage electrode contact hole on the second interlayer insulating layer;

forming a first storage electrode contact hole using the photoresist pattern as an etch mask and using the silicon nitride layer as an etch stop layer;

etching the etch stop layer;

etching the first interlayer insulating layer using the first storage electrode contact hole as an etch mask, and thus forming a second storage electrode contact hole;

enlarging a lower portion of the second storage electrode contact hole so that the lower portion of the second storage electrode contact hole is wider than an upper portion of the second storage electrode contact hole;

providing a conductive material within the first storage electrode contact hole and the second storage electrode hole.

10. The method according to claim 9, wherein the enlarging step includes a wet etch process or a dry etch process.

11. The method according to claim 7, wherein forming the neighboring buried gates includes:

forming a buried gate reserved area in the semiconductor substrate;

providing a conductive material for a gate in the buried gate reserved area, and performing an etch-back process on the conductive material; and forming a capping nitride layer over the etched-back conductive material.

12. A method for forming a semiconductor device comprising:

forming neighboring buried gates on a semiconductor substrate including an active region;

forming an insulating layer on the semiconductor substrate;

selectively removing the insulating layer from at least a region over an upper part of the active region;

forming a bit line on the upper part of the active region between the neighboring buried gates; and forming a storage electrode contact plug that is adjacent to the bit line and that has a laterally extending lower portion, wherein selectively removing the insulating layer includes:

forming a photoresist pattern on the insulating layer using an exposure mask that includes a shielding pattern having a width smaller than that of the buried gate; and etching the insulating layer using the photoresist pattern as an etch mask, and wherein forming the bit line includes:

forming a first interlayer insulating layer and a bit line contact plug on the active region between the neighboring buried gates;

forming a bit line electrode, a first nitride layer, and a hard mask layer on the first interlayer insulating layer, the bit line electrode contacting the bit line contact plug;

etching the hard mask layer, the first nitride layer and the bit line electrode to form a bit line structure; and forming a bit line spacer on a sidewall of the bit line structure.

13. The method according to claim 12, wherein forming the bit line contact plug includes:

forming a first interlayer insulating layer on the semiconductor substrate;

forming a photoresist pattern for defining a bit line contact hole on the first interlayer insulating layer;

etching the first interlayer insulating layer using the photoresist pattern as an etch mask so as to expose the semiconductor substrate; and forming a conductive material for the bit line contact plug on an entire surface of the semiconductor substrate, and performing a planarization etch process on the conductive material so as to expose the first interlayer insulating layer.

14. The method according to claim 12, wherein forming the storage electrode contact plug includes:

forming a silicon nitride layer on the insulating layer including the bit line;

forming a second interlayer insulating layer on the silicon nitride layer;

forming a photoresist pattern defining a storage electrode contact hole on the second interlayer insulating layer;

forming a first storage electrode contact hole using the photoresist pattern as an etch mask and using the silicon nitride layer as an etch stop layer;

etching the etch stop layer;

etching the first interlayer insulating layer using the first storage electrode contact hole as an etch mask, and thus forming a second storage electrode contact hole;

enlarging a lower portion of the second storage electrode contact hole so that the lower portion of the second storage electrode contact hole is wider than an upper portion of the second storage electrode contact hole;

providing a conductive material in the first storage electrode contact hole and the second storage electrode hole.

15. The method according to claim 14, wherein the enlarging step includes a wet etch process or a dry etch process.

16. The method according to claim 12, wherein forming the neighboring buried gates includes:

forming a buried gate reserved area in the semiconductor substrate;

providing a conductive material for a gate in the buried gate reserved area, and performing an etch-back process on the conductive material; and forming a capping nitride layer over the etched-back conductive material.

17. A semiconductor device comprising:
- neighboring buried gates in a semiconductor substrate including an active region;
- an insulating layer formed on the buried gate;
- a bit line formed on an upper part of the active region between neighboring buried gates; and
- a storage electrode contact plug that is formed at both sides of the bit line, the storage electrode contact plug having a lower portion that is wider than an upper portion,
- wherein the bit line includes a bit line contact formed on the active region between the neighboring buried gates, a first interlayer insulating layer pattern formed at sidewalls of the bit line contact, a laminated structure including a bit line electrode, a first nitride layer, and a hard mask layer, the laminated structure being provided on the bit line contact plug and the first interlayer insulating pattern, and a bit line spacer formed on sidewalls of the laminated structure,
- wherein the buried gate includes a gate electrode that is buried in a lower part of a buried gate reserved area in the semiconductor substrate, and a capping nitride layer that is formed over the gate electrode and is buried in the buried gate reserved area, and
- wherein the insulating layer is formed on the capping nitride layer and is buried in the buried gate reserved area.

18. The semiconductor device according to claim 17, wherein the bit line includes
- a bit line spacer formed on a sidewalls of the laminated structure and the first interlayer insulating layer pattern.

19. The semiconductor device according to claim 17, wherein the insulating layer is formed on the capping nitride layer and is narrower than the buried gate.

20. The semiconductor device according to claim 17, further comprising:
- a storage electrode contact plug spacer formed on a sidewall of the bit line spacer.

* * * * *